United States Patent

Aston

[11] Patent Number: 5,587,093
[45] Date of Patent: Dec. 24, 1996

[54] SAFE POTENTIAL ARC CHANNEL ENHANCED ARC HEAD

[75] Inventor: Graeme Aston, Monument, Colo.

[73] Assignee: Electric Propulsion Laboratory, Inc., Monument, Colo.

[21] Appl. No.: 459,332

[22] Filed: Jun. 2, 1995

[51] Int. Cl.⁶ .................................................. B23K 10/00
[52] U.S. Cl. .......................... 219/121.48; 219/121.47; 219/121.52; 219/121.36; 315/111.21
[58] Field of Search ................... 219/121.48, 121.47, 219/121.52, 75, 121.49, 121.36; 315/111.21, 111.31; 427/446, 571–581

[56] References Cited

U.S. PATENT DOCUMENTS

Re. 34,806  12/1994  Cann ......................................... 427/446
5,149,932   9/1992   Poorman et al. .......................... 219/75

Primary Examiner—Mark H. Paschall

[57] ABSTRACT

A gas ionizable to produce a plasma is introduced into a arc head and a plasma discharge is initiated at voltages less than 50 V between a high resistance helix, impregnated with low work function materials, within the arc head, and a downstream arc channel electrode. Plasma from this discharge migrates into a gap between the arc channel electrode and a weld work piece creating a conducting path adequate to draw a high current arc column from the arc head to the weld work piece at arc initiation voltages less than 50 V. Increased energy density and penetration of the melt zone at the weld work piece is enabled by a predominately axial magnetic field around the arc column, with other magnetic fields enabling manipulation of the arc column over the weld work piece. Further manipulation of the arc head plasma discharge allows a vigorous metal vapor deposition process to be performed which can be sustained simultaneously with a welding operation.

23 Claims, 13 Drawing Sheets

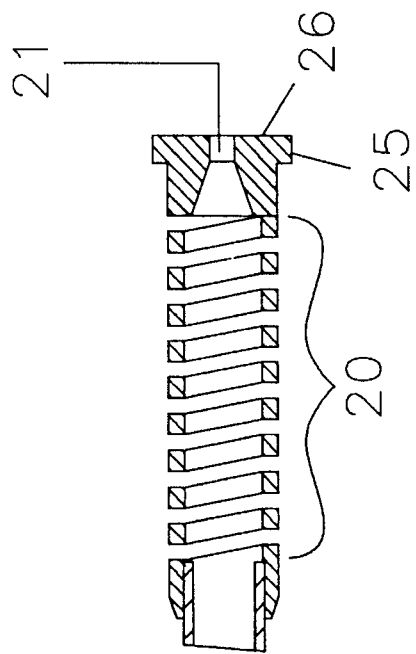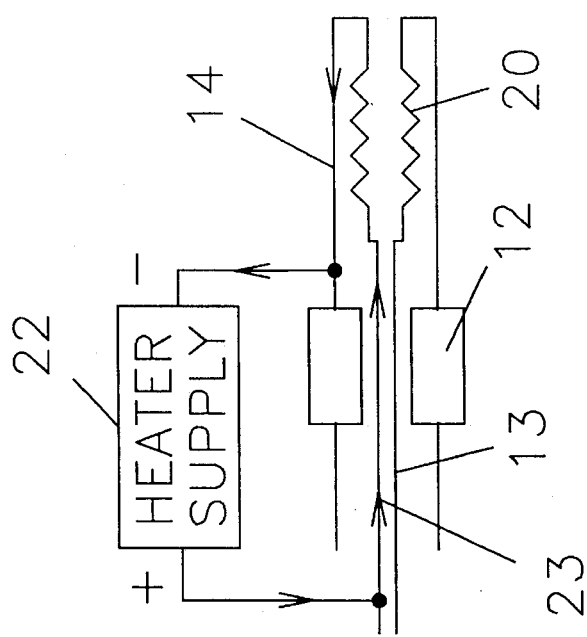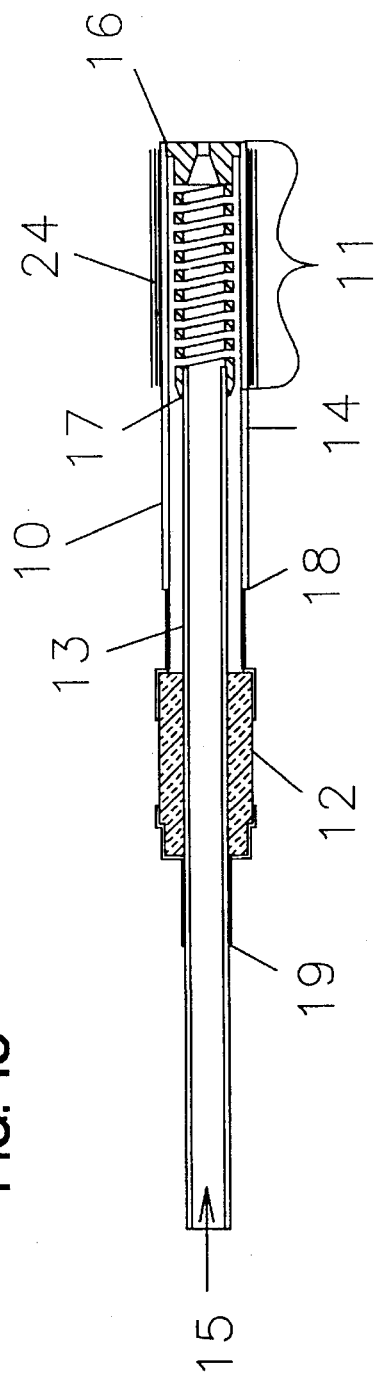
FIG. 1B
FIG. 1C
FIG. 1A

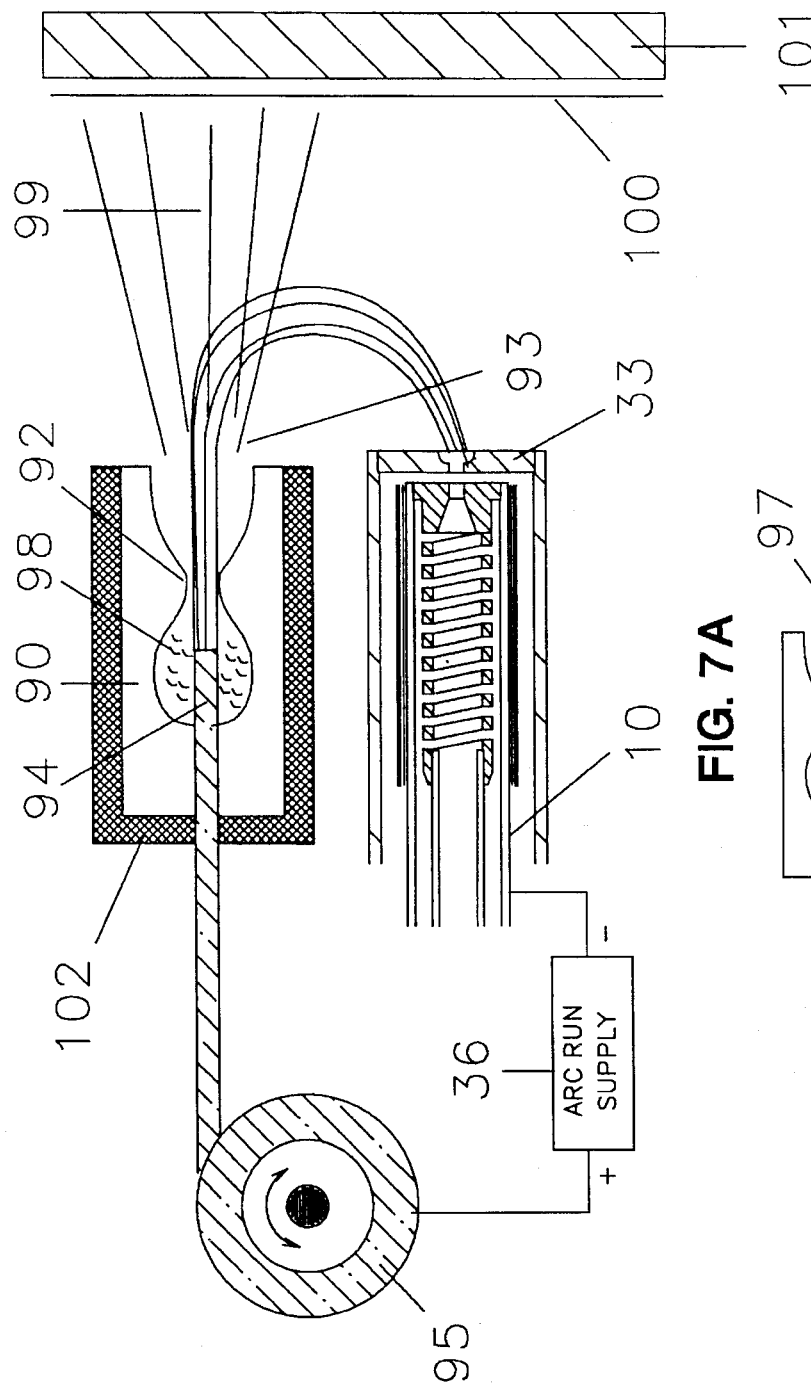
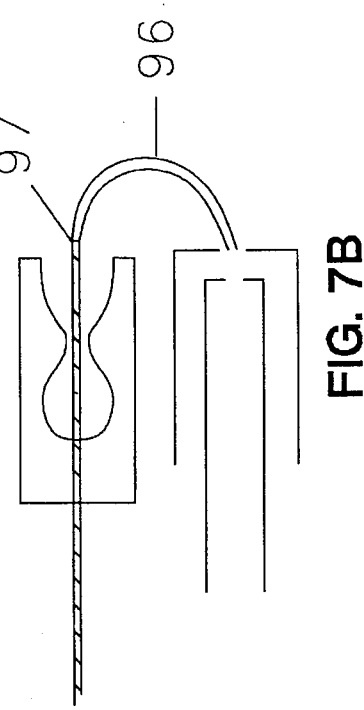
FIG. 7A
FIG. 7B

SAFE POTENTIAL ARC CHANNEL ENHANCED ARC HEAD

BACKGROUND OF THE INVENTION

This current generally relates to low gas flow plasma electron current arc sources for use in a vacuum environment. The arc head disclosed is of a hollow cathode type where a propellant, reduced to a gaseous state, is ionized by electron bombardment from a low work function emitter of copious quantities of thermal electrons. The electron current drawn from this type of arc head can be used for a variety of space and ground based purposes which include vacuum arc welding, vacuum metal vapor deposition, ion beam and spacecraft charge neutralization, and as a propulsion device for spacecraft attitude and orbit maintenance and repositioning functions.

Hollow cathode arc sources for use in a vacuum environment are known. Typically, the hollow cathode is in the form of a tube with one end either open or stopped down, with electrons originating from the tube walls or from a low work function material impregnated structure within the tube, and with the hollow cathode tube structure initially heated to electron emitting temperatures either by indirect resistance heating or by direct heating from glow discharge processes. The arc from simple open tube hollow cathodes has been used for vacuum welding as has the arc from a simple stopped down hollow cathode. Attention is directed to U.S. Pat. No. 5,149,932 by R. M. Poorman and J. L. Weeks. Disadvantages of this type of hollow cathode for vacuum welding are that voltages as high as 20,000 volts are required to initiate the arc, the electron emission occurs at very high temperatures promoting component erosion and short life time, coolant is required, gas flow rate requirements are relatively high, arc start-up is not completely reliable or well defined, and melt zone penetration is poor.

Prior art hollow cathode arc sources for vacuum arc welding have been limited in their usefulness and ease of operation.

SUMMARY OF THE INVENTION

The present invention provides a significantly improved hollow cathode arc source. This safe potential arc channel enhanced arc head has many unique operating characteristics and capabilities which form the basis for a versatile vacuum welding system, in addition to enabling its use in functions presently being performed by prior art hollow cathode arc sources.

One feature relates to the use of a single piece porous tungsten insert/heater/orifice plate integrated into the design of which is a high resistance electron emitter helix impregnated with low electronic work function materials.

A further feature relates to the use of a coaxial outer body tube containing the single piece emitter, and an inner gas flow tube attached to the emitter, with the electrical heating and bias circuit for the emitter being also this outer body tube and this gas flow tube.

Another feature relates to an arc extraction electrode to initiate the plasma electron emission process from the arc head and to place the arc head in a standby operating mode and to provide conductive plasma coupling to weld samples to enable low voltage initiation of arc welding.

An additional feature relates to the arc extraction electrode to maximize arc column pressure and to guide the arc column from the arc head to the weld work piece while preventing migration of weld melt zone vapor products upstream of the arc column and poisoning the arc head insert/heater/orifice plate component.

A further feature is the use of a solenoid around the arc head to create a predominately axial magnetic field to concentrate the electron current and ionization processes in the arc column, and thus increase the arc column plasma density and voltage, and thereby substantially increase the arc column energy density transferred to the weld work piece, and also to substantially increase the penetration depth of the melt zone for welding and cutting applications.

Yet another feature relates to routing the arc column current through the axial solenoid around the arc head to eliminate the need for a separate solenoid power supply and to provide an axial magnetic field strength which increases with arc current increases, thus proportionately increasing the penetration depth of the met zone.

Still another feature is the use of a tubular permanent magnet around the arc head magnetized along its axis to produce a predominately axial magnetic field and to thereby produce the same benefits to the welding process as an axial magnetic solenoid but without the need for a power source to maintain the magnetic field.

An additional feature is the use of a magnetic field source beneath non-magnetic weld materials to concentrate the arc head externally applied magnetic field at the melt zone to the further increase the arc column energy density and depth of penetration.

A further feature is the use of steering magnetic solenoids around the tip of the outer diameter of the arc head to steer the arc column over the weld materials in any 360° path about the central axis of the arc head as the arc head traverses the weld materials.

Yet another future is the use of a light source shining through the length of the hollow arc head to precisely locate the arc column attachment site on the weld piece prior to starting the welding operation.

Still another feature is the ability of the arc head to operate in a repetitive pulse mode from a discharging capacitor bank and thereby produce an arc column of several thousand and higher ampere for periods of microseconds for low heat transfer vacuum welding.

An additional feature is the provision of a gas flow control system to the arc head which can provide a multiplicity of gas flow control levels including a minimum gas flow for standby mode arc head operation, a large steady state gas flow for steady state and moderate current pulsed welding, and a very large pulsed gas flow with the gas flow pulse timed to enable very high current repetitively pulsed, capacitor discharge pulse welding.

Yet another feature is routing the current pulse from a repetitively pulsed capacitor bank through an electromagnet solenoid around the arc head and also through the arc head arc column to thereby further pinch the arc column and increase the energy density of the arc column and the subsequent depth of penetration into the weld work piece.

An additional feature is coupling the arc head column to a reduced channel length keeper electrode to generate an intense accelerated plasma stream capable of welding a work piece without need of an anode power supply connection to the work piece. Such configuration of the arc column attachment being capable of operation in a steady state mode, with and without a steady state applied electromagnetic solenoid field, or a repetitively pulsed very high current mode, with and without routing of the current pulse through an electromagnetic solenoid, and with the accelerated plasma stream being useful also for space propulsion applications.

Yet another feature is use of the arc based with its power supplies and gas flow configured to generate an accelerated plasma plume which can be used to remove the oxide layer from aluminum prior to welding aluminum, and then automatically reconfiguring the power supplies and gas flow to use the arc head to weld the pre-cleaned aluminum.

A further feature is use of a reducing gas such as hydrogen mixed in with the arc head gas flow to augment the oxide cleaning process from aluminum.

A further feature is the ability of the arc head to operate in a self-triggering mode so that the arc head can itself serve as the high current switch in repetitively triggering the high current pulse from a discharging capacitor bank.

Still another feature is the use of the arc head as either a steady state or pulse arc source with coupling of the arc column to a selection of wire feed conductive anode materials for heating and metal vapor deposition of these anode materials onto a wide variety of substrates.

An additional feature is insertion of conductive wire feed anode materials into an electrically insulating chamber whose exit closes down to a throat followed by an expansion nozzle, and use of the arc head to vaporize the wire feed anode materials to produce a relatively high insulated chamber pressure of metal vapor products for expulsion at high velocity and with great directionality at downstream substrates.

A further feature is simultaneous use of the arc head as a metal vapor deposition source during vacuum welding operations to allow metal mixing at the melt zone and thereby enable successful weld joints to be performed between different metals by deposition of a third material to promote formation of a sound metallurgical bond.

A further feature is the use of a filler wire incorporating a separate power supply for coupling a portion of the arc column current to the filler wire tip for enhanced incorporation of the filler wire into the melt zone.

An additional feature is use of a battery power source to power the arc head during on-orbit applications.

These and other advantages and attainments of the present invention will become apparent to those skilled in the art upon a reading of the following detailed description when taken in conjunction with the drawings wherein is shown and described an illustrated embodiment of the invention.

BRIEF DESCRIPTION OF THE DRAWINGS

FIG. 1A is a cross-sectional view of the arc head representing one embodiment of the present invention.

FIG. 1B is an enlarged cross sectional view of one embodiment of the insert/heater/orifice plate of FIG. 1A.

FIG. 1C is a schematic representation of the electrical energizating circuitry used to pass a heating current through the insert/heater/orifice plate of FIG. 1A.

FIG. 7A is a schematic representation of a metal vapor deposition embodiment of the arc head in FIG. 1A.

FIG. 7B is a schematic representation of the arc head embodiment in FIG. 7A showing method of striking arc plasma.

DETAILED DESCRIPTION OF THE PREFERRED EMBODIMENTS

Figure 2A:
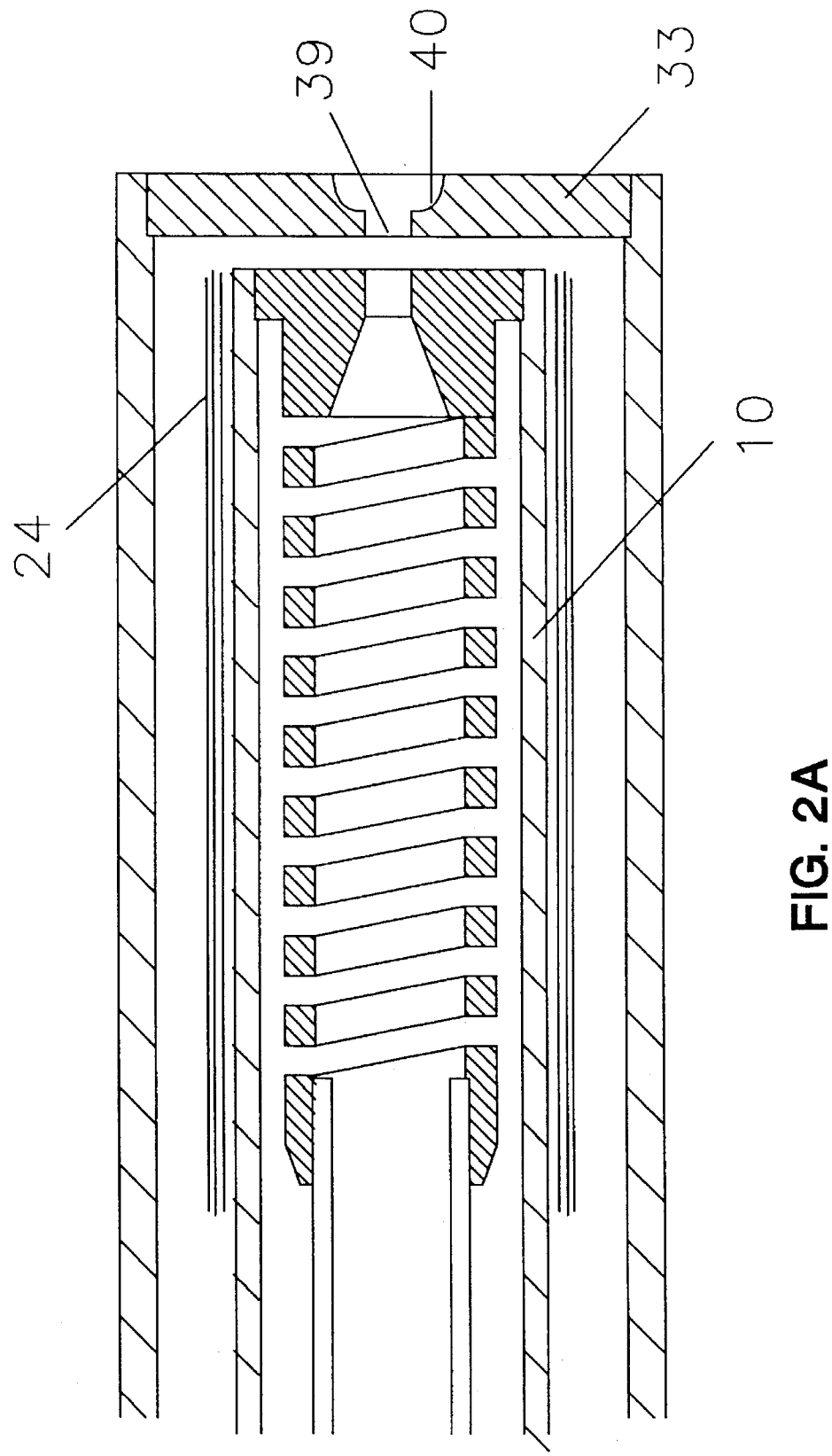
FIG. 2A is a cross-sectional view of one embodiment of the arc head of FIG. 1A configured for use in vacuum welding.

Referring to FIG. 1A a safe potential arc channel enhanced arc head 10 according to the present invention is comprised of four components which include an insert/heater/orifice plate 11, a tube coupler insulator 12, a gas inlet/input current tube 13, and a body/return current tube 14. A gas flow 15 is fed from the upstream, or rear, of the arc head 10 passing through the gas inlet/input current tube 13 and through the insert/heater/orifice plate 11.

The four arc head 10 components are joined by welds which include a weld 16 between the downstream end of the insert/heater/orifice plate 11 and the downstream end of the body/return current tube 14, a weld 17 between the downstream end of the gas inlet/input current tube 13 and the upstream end of the insert/heater/orifice plate 11, a weld 18 between the downstream end of the tube coupler insulator 12 and the upstream end of the body/return current tube 14, and a weld 19 between the upstream end of the tube coupler insulator 12 and the gas inlet/input current tube 13. Reference to the welds for these joints is to emphasis that these welds must form joints which will operate at high temperatures, ranging from about 300 C. to about 1,300 C., with strength and without outgassing. A combination of prior art weld types such as Tungsten Insert Gas (TIG) welding, high temperature brazes, and electron beam welds can be used to form these joints, as also can the joints all be made using the arc head 10 itself as the welding system.

The tube coupler insulator 12 in the arc head 10 must be manufactured from a high temperature insulator material such as alumina. Similarly, the gas inlet/input current tube 13 and the body/return current tube 14 must be manufactured from a high temperature refractory metal conductor, with low resistivity, such as molybdenum, tantalum, tungsten, and their alloys.

FIG. 1B shows an enlarged detail of the insert/heater/orifice plate 11. The insert/heater/orifice plate 11 is machined from porous tungsten of nominal density 80% into which has been impregnated a mixture of low work function materials. Such materials can include a 4:1:1 molar emissive mix of barium carbonate, calcium carbonate, and aluminum oxide. The treatment of porous tungsten by impregnation of such materials to lower the electronic work function of the tungsten is known. By machining the impregnated porous tungsten into a helix 20, this component assumes the general geometry of a long length resistive heating element. Consequently, the impregnated porous tungsten becomes its own heating element. In addition, this integrated heater is within the interior of the arc head 10 where it is most thermally efficient and most volume efficient. Furthermore, simultaneously machining the emission orifice 21 into the same porous tungsten component eliminates the need for a separate orifice plate to cap off the end of the arc head 10.

FIG. 1C shows schematically the electrical input power connections and current flow paths in the arc head 10. A heater power supply 22 provides an electrical potential between the gas inlet/input current tube 13 and the body/return current tube 14. The heater power supply 22 can provide a heating current 23 which can be either a direct current, or an alternating current. The alternating current can be typical line frequency of order 50–60 Hz, or it can be of order tens of kHz and greater as is typical of known switching power supplies. To prepare the arc head 10 for electron emission, the heater power supply 22 is switched on and a heater current 23 is passed from the gas inlet/input current tube 13, through the insert/heater/orifice plate 11 and back through the body/return current tube 14 to complete the circuit back to the heater power supply 22. As a consequence of Ohmic heating caused by the passage of the heater current 23, the relatively high resistance insert/heater/orifice plate 11 rapidly rises to a temperature high enough to cause copious quantities of thermal electrons to be produced along the surfaces of the low work function material impregnated porous tungsten of the helix 20. The number of thermal electrons generated by the arc head 10 helix 20 far exceeds that produced by prior art hollow cathode emitters because the helix 20 has an effective surface area for electron emission factors of several greater than any electron emitting insert in prior art hollow cathode emitters which typically can emit electrons from either one side of a disc insert emitter, or from the inside surface of a hollow cylindrical insert emitter. The efficiency of the heater power supply 22 in brining the insert/heater/orifice plate 11 to operating temperature is enhanced by the pressure of a thin, refractory metal dimpled foil, loosely wrapped around the downstream end of the body/return current tube 14 to form a thermal radiation shield 24 over a length commensurate with the general length of the insert/heater/orifice plate 11. Further reduction in insert/heater/orifice plate 11 heat loss is accomplished by the use of a thin wall body/return current tube 13 to minimize heat conduction losses through the body/return current tube 13.

The magnitude of the heater current 23 is selected to rapidly heat the insert/heater/orifice plate 11 to a temperature whereupon copious quantities of thermal electrons are available over the surfaces of the helix 20, and also the interior surfaces of the emission orifice 21. The ideal temperature range for thermal electron emission depends on the type of impregnant used in the porous tungsten insert/heater/orifice plate 11. Typically, a 4:1:1 molar emissive mix of barium carbonate, calcium carbonate, and aluminum oxide requires a temperature in the range of about 1,050–1,150 C. To achieve these temperatures in this impregnant requires a direct current heater current 23 of order 60 A, and an input power of order 180 W, for an arc head 10 whose body/return current tube 14 outside diameter is about 0.55". The insert/heater/orifice plate 11 resistance is a minimum when cold, and rises to a maximum value at the desired operating temperature. This characteristic, and the high inherent temperature capability of tungsten, enables the heater supply 22 to be operated in a constant power mode wherein the initial heater current 23 is much larger than 60 A due to the low resistance of the cold insert/heater/orifice plate 11, and wherein this heater current 23 gradually reduces to its steady state value of 60 A as the insert/heater/orifice plate 11 is heated to its desired equilibrium temperature. Using this constant input power approach, an arc head 10 with a body/return current tube 14 outside diameter of 0.55" will reach an average insert/heater/orifice plate 11 temperature of 1,100 C. in about two to three minutes. By contrast, applying a constant heater current 23 of 60 A results in a heating time of order four to five minutes.

The helix 20 in FIG. 1B tends to be hottest at a location mid-way along its length due to heat conduction losses at the connection to the orifice plate 25 and heat conduction losses at the weld 17 connecting the helix 20 to the gas inlet/input current tube 13. Although the helix 20 could, in principal, be manufactured with any number of turns, experience has shown that about eight to twelve turns is a good compromise. With about this general number of turns, the helix 20 has adequate resistance to be the dominant voltage drop in the heater power supply 22 circuit, while still providing a mechanically stable structure which can be used in a wide variety of different sized arc heads 10. In this regard, arc heads 10 have been manufactured with body/return current tube 14 outside diameters which have varied from 0.27" to 0.55", although even much larger diameters are possible. By scaling the helix 20 of the insert/heater/orifice plate 11 components of these differently sized arc heads 10, the heater current 23 has varied from about 16 A at 0.27" to about 60 A at 0.55", however, the voltage drop across the insert/heater/orifice plate 11 has been fairly consistent at about 3 volts. This feature is important since it allows different size arc heads 10 to be used in an application such as welding, wherein the arc head 10 size could be changed to accommodate the different weld power levels demanded of various thickness metals, while retaining a common heater power supply 22. Although only a single helix 20 is shown in FIG. 1B, a double, or even a double, helix 20 could also be used to provide a high resistance to the insert/heater/orifice plate 11. Use of a multiple helix 20 geometry provides another method of controlling the resistance and voltage drop along this component, and also a means of providing additional strength. Moreover, it is understood that while a helix 20 is a desirable geometry for the high resistance portion of the insert/heater/orifice plate 11, it is also understood that other geometries may also be machined into the porous tungsten insert/heater/orifice plate 11 component to also achieve high resistance with adequate mechanical strength.

The insert/heater/orifice plate 11 is manufacture from porous tungsten which is impregnated with a mixture of low work function materials. The higher the porosity of the tungsten, the greater the amount of low work function material which can be impregnated into its structure, and the longer the operation life of the arc head 10 before this material is depleted. However, higher porosity also means lower structural strength, with greater part fabrication difficulties due to increased breakage. Similarly, decreasing the porosity of the tungsten in the insert/heater/orifice plate 11 increases the mechanical strength of this component, but also reduces its useful life as an electron emitter because of a reduced load of low work function impregnant materials. Experience has shown that a good compromise in porous tungsten for the insert/heater/orifice plate 11 is a porous tungsten manufactured to be about 75–85% dense.

Impregnation of the insert/heater/orifice plate 11 with low work function material is performed along the length of the helix 20 only, and only if that portion of the helix 20 which is not used to form the weld 17 between the helix 20 and the gas inlet/input current tube 13 since the impregnant would contaminate the weld 17 resulting in a poor mechanical joint. Similarly, impregnating the orifice plate 25 of the inert/heater/orifice plate 11 results in electron emission from large thermal mass sites along the orifice plate interior 21, causing overheating and inefficient operation. Also, impregnating the orifice plate 25 can cause the electron emission site to couple to the downstream face 26 of the orifice plate 25 with similar overheating and low efficiency operation of the arc head 10.

The arc head 10 insert/heater/orifice plate 11 can be heated to a temperature of order 1,100 C. to emit copious quantities of thermal electrons in a time period as short as two minutes due to the direct integration of the resistance heating function into the insert/heater/orifice plate 11, and the high power handling capability of this tungsten component. A further advantage of this design is that the arc head 10 tends to be self-cleaning in that the direct action of the integrated resistance heater in the insert/heater/orifice plate 11 rapidly evaporates from the surface of the impregnated helix any water vapor, and other contaminates that may have settled on the surface of this component during its exposure to atmosphere following bleed-up from a vacuum operation environment. This characteristic is contrary to prior art hollow cathodes using indirectly heated low work function impregnated porous tungsten inserts which require consistent purging with an inert gas after use to prevent their inserts from being poisoned during normal atmospheric exposure, and thereby preventing them from functioning reliably again, or at all. The high power handling capability of the directly heated arc head 10 insert/heater/orifice plate 11 allows this component to be heated to temperatures much high than 1,100 C. for short time periods to forcibly clean off the insert/heater/orifice plate 11 surfaces should even serious contamination have occurred. For example, an arc head 10 with a body/return current tube 14 outside diameter of 0.55" which has a nominal helix 20 heater current 23 of 60 ampere can safely handle a heater current 23 increases up to 90 ampere. Moreover, unlike prior art hollow cathodes using indirectly heated low work function impregnated porous tungsten inserts, which typically require up to several hours of careful heating cycles to be conditioned for reliable electron emission, the directly heated design of the insert/heater/orifice plate 11 of the arc head 10 permits it to function immediately after manufacture without preheating conditioning cycles, and with extremely reliable and repeatable electron emission characteristics.

The arc head 10 can only function in a vacuum environment. Internal gas pressures in the vicinity of the helix 20 during welding operations with the arc head 10 are of the order of a few Torr. Similarly, the background pressure surrounding the arc head 10 during welding operations, or operation of the arc head 10 in any of its many embodiments, must be less than about $5 \times 10^{-3}$ Torr, or else Paschen glow discharges will occur between the arc head 10 and other anode biased surfaces than that directly beneath the arc head 10.

Figure 2B:
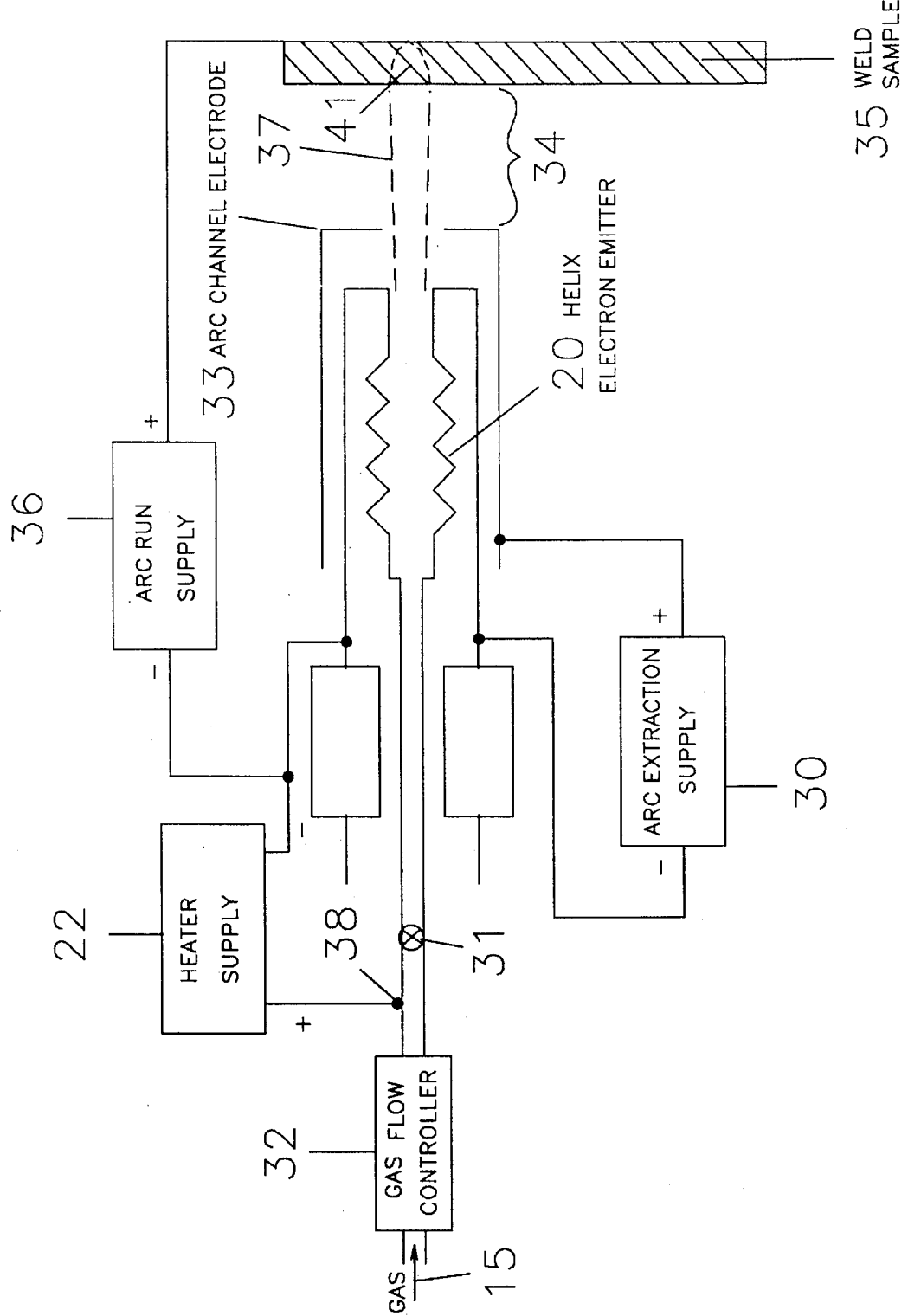
FIG. 2B is a schematic representation of the electrical energizating circuitry and gas flow control requirements of the vacuum welding embodiment in FIG. 2A of the arc head in FIG. 1A.

FIG. 2A shows the arc head 10 configured for vacuum welding applications. FIG. 2B shows schematically one embodiment of the electrical input power connections and gas flow connections for the arc head 10 to perform vacuum welds. For operation in a transferred arc welding mode as noted in FIG. 2B, the heater supply 22 is turned on and the insert/heater/orifice plate 11 rapidly heated to a temperature of approximately 1,100 C. at which point copious quantities of thermal electrons are available at the surface of the helix 20. The arc extraction supply 30 is turned on at the same time as the heater supply 22, or shortly thereafter. Similarly, the gas flow 15 is initiated at approximately the same time as the heater supply 22 is turned on by opening the gas valve 31, with the magnitude of the gas flow 15 controlled by the gas flow controller 32. A positive potential of a few tens of volts is applied by the arc extraction supply 30 to the arc channel electrode 33. For an arc head 10 whose body/return current tube 14 outside diameter is 0.55", the open circuit positive potential applied to the arc channel electrode 33 is about 40 V, and the gas flow is about 50 sccm. When the insert/heater orifice plate 11 temperature has reached approximately 1,100 C., enough thermal electrons are available to initiate an arc discharge from the helix 20 to the arc channel electrode 33. This discharge is by definition always an arc since it starts at typically less than 40 V and has a negative impedance characteristic, wherein the arc extraction supply 30 must be maintained in a current regulation mode to prevent arc current run away. With the arc established between the helix 20 and the arc channel electrode 33, low energy ions in the arc column tend to migrate upstream and collide wit the helix 20 where they impart their kinetic energy to the helix 20, resulting in additional heating of the helix 20. This efficient helix 20 self-heating operating mode allows the electrical power from the heater supply 22 to be reduced to about 40% of its initial arc head 10 start-up value while still providing adequate total heating power to the insert/heater orifice plate 11 to maintain a stable arc discharge to the arc channel electrode 33. For an arc head 10 with a body/return current tube 14 outside diameter of 0.55", an arc current of 2.5 A is sufficient to provide adequate helix 20 self-heating to enable this significant reduction in heater supply 22 electrical power.

With an arc established between the helix 20 and the arc channel electrode 33, the gap 34 between the arc channel electrode 33 and the weld sample 35 becomes conducting due to the presence of free ions and electrons ejected from the helix 20-to-arc channel electrode 33 arc discharge. A positive potential applied to the weld sample 35 from the arc run supply 36 couples this arc to the weld sample 35 where the high current capability of the arc run supply 36 permits the attachment point of the arc column 37 to melt the weld sample 35. The arc column 37 will tend to have a direction which is determined by the general direction of the gas flow 15 leaving the arc channel electrode 33 since the charge carriers to support creation of the arc column are created from the gas flow 15. For an arc head with a body/return current tube 14 outside diameter of 0.55", an open circuit voltage of approximately 40 V is adequate to couple the arc column 37 to the weld sample 35. In FIG. 2B, the heater supply 22 bias is such that the downstream tip of the helix 20 is negative relative to the heater supply 22 common point 38. This bias arrangement ensures that electrons are predominately drawn from the downstream end of the helix 20, with a minimum of voltage drop incurred by the arc run supply 36. Although one embodiment of the heater supply is shown incorporating a direct current heating voltage, it is understood that a high frequency alternating heating voltage could also be used to heat the helix 20.

For an arc head 10 with a body/return current tube 14 outside the diameter of 0.55", arc column 37 currents of order 100–150 A for welding require argon gas flows 15 of order 30–50 sccm. However, the arc head 10 may be started at much smaller gas flows. Typically, an arc head 10 with a body/return current tube 14 outside diameter of 0.55" can be reliably started to establish an arc discharge between the helix 20 and the arc channel electrode 33 using a gas flow 15 of 2.5 sccm. This feature is particularly important for welding in space where consumption of gas must always be strictly limited. For these applications, and other similarly sensitive ground based vacuum welding applications, the arc head 10 may be started at a gas flow 15 which is 20–40 times less than the gas flow used for high current vacuum welding. Moreover, immediately following a weld, the high arc column 37 current to the weld sample 35 can be turned off, the arc head gas flow 15 can be cut back to the very low rate used for starting, and the arc head 10 can be placed in a low input power, very low gas glow 15, standby mode of operation wherein only the low current arc discharge between the helix 20 and the arc channel electrode 33 is left on. In this standby operating mode, the arc head 10 can virtually instantaneously respond to sudden welding current demands from the arc run supply 36 once the gas flow controller 32 has been commanded to increase the gas flow 15 to the level required to support high current welding. Typical gas flow 15 levels for an arc head 10 whose body/return current tube 14 outside diameter is 0.55" are 30–75 sccm for arc column 37 currents of order 100–200 A. By contrast, standard industrial TIG and plasma welding torches operating in glove boxes and purge chambers, require gas flows 15 of order 20,000 sccm for similar arc column 37 currents.

Figure 2C:
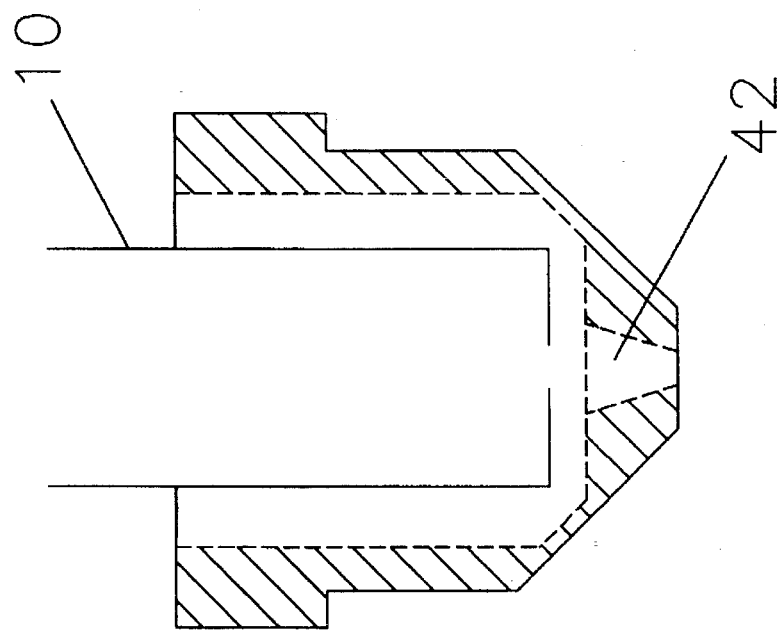
FIG. 2C is a cross-sectional view of one embodiment of the arc channel electrode of the vacuum welding arc head embodiment of FIG. 2A.

FIG. 2A shows one embodiment of the arc channel electrode 33 which incorporates a short channel 39 inlet followed by a bell shaped outlet 40. Analysis of the melt zones 41 resulting from test weld samples 35 has shown that the energy density deposited by the arc column 37 from the arc head 10 is increased with the arc channel electrode 33 shaped as shown in FIG. 2C. The converging arc channel electrode 42 in FIG. 2C increases the local gas pressure surrounding the arc column 37, which in turn increases the density of the plasma in the arc column 37 and the voltage drop along the axial length of the arc column 37, which in turn increases the energy density at the attachment site of the arc column 37 to the weld sample 35. Moreover, the higher pressure in the arc column 37 of the converging arc channel electrode 42 further isolates migration of the vapor of the vigorous melt zone 41 processes occurring at the weld sample 35 from reaching the arc head 10 electron emitting helix 20, and thus potentially contaminating the effectiveness of this component. The arc channel electrode 42 must be made from a high temperature refractory metal such as molybdenum, tantalum, tungsten, or alloys of these metals.

Figure 2D:
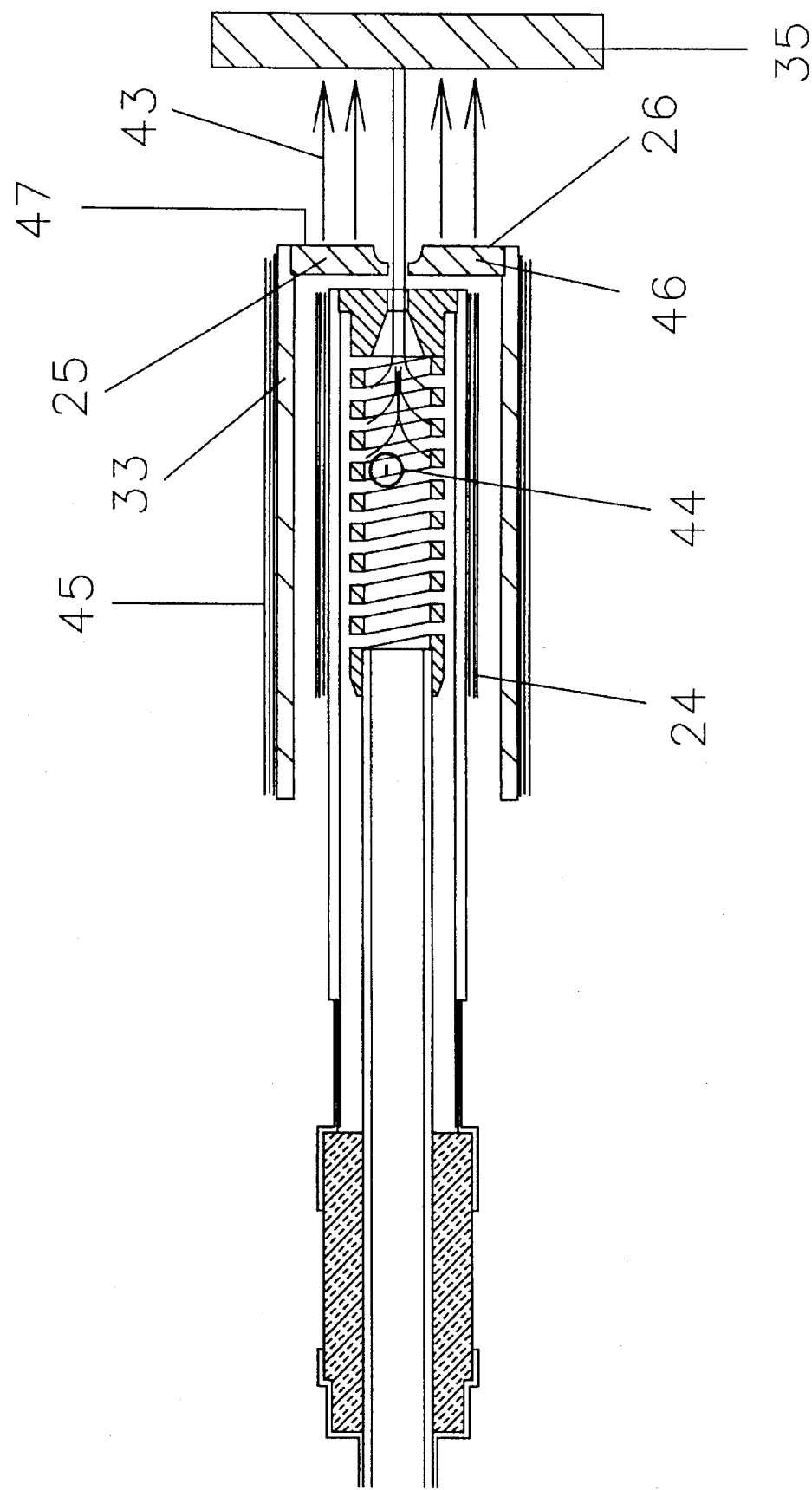
FIG. 2D is a schematic representation of the heat rejection paths and processes of the arc head welding embodiment of FIG. 2A.

The arc head needs no active cooling as is used on prior art hollow cathode arc sources for vacuum welding. Measurements have been taken of the fraction of electrical input power to the arc head 10 which is transferred to the weld sample 35 as net heating power, and typically this fraction is in excess of 80% FIG. 2D shows schematically that the arc head 10 rejects heat by downstream thermal radiation 43 and by electron cooling 44. The thermal design of the arc head is to use multiple wraps of refractory metal foil thermal radiation shielding 24 over the body/return current tube 14 to minimize heat loss from the insert/heater orifice plate 11. Similarly, multiple wraps of refractory metal foil thermal radiation shielding 45 cover the outside surface of the arc channel electrode 33 to prevent significant radiative heat loss through this surface. The heat generated by the helix 20 is conducted to the downstream face 26 of the orifice plate 25 where it radiates to the arc channel electrode orifice plate 46 whose downstream face 47 directs this thermal radiation 43 to the weld sample 35. Since the arc head 10 is always passing over a relatively cool portion of the weld sample 35, the thermal radiation 43 is transferred to the weld sample 35, thus creating an effective means of removing excess heat energy from the arc head 10. Furthermore, additional cooling of the helix 20 is provided by the process of electron cooling 44 whereby each electron that leaves the helix 20 carries with it an amount of equivalent heat energy from the helix 20 which corresponds to approximately the product of the electron change times the electronic work function voltage to free the electron from the helix 20. The energy represented by this electron cooling 44 process is carried by the arc column 37 to be deposited into the weld sample 35.

Choice of gas flow 15 types into the welding embodiment of the arc head 10 has been investigated. Inert gases have been examined including krypton, argon and helium, and blends of these gases, with argon offering a good all around choice for good melt zone penetration and minimal gas flow 15 rate requirements. Although oxygen and oxygen bearing gases such as carbon dioxide cannot be used in the arc head 10 due to contamination and erosion of the insert/heater orifice plate 11, hydrogen and hydrogen bearing gases can be used successfully in the arc head 10 for welding processes. This feature is especially important for aluminum welding since a low power density, hydrogen rich arc column from the arc head 10 can be used to chemically reduce the oxide layer from aluminum weld samples. By passing the arc head 10 over aluminum samples in this way to clean their surfaces of any oxide layers, a pure aluminum surface is exposed for welding by the arc head which is passes over the aluminum weld sample again in a high arc column 37 current mode while operating on argon.

Figure 3A:
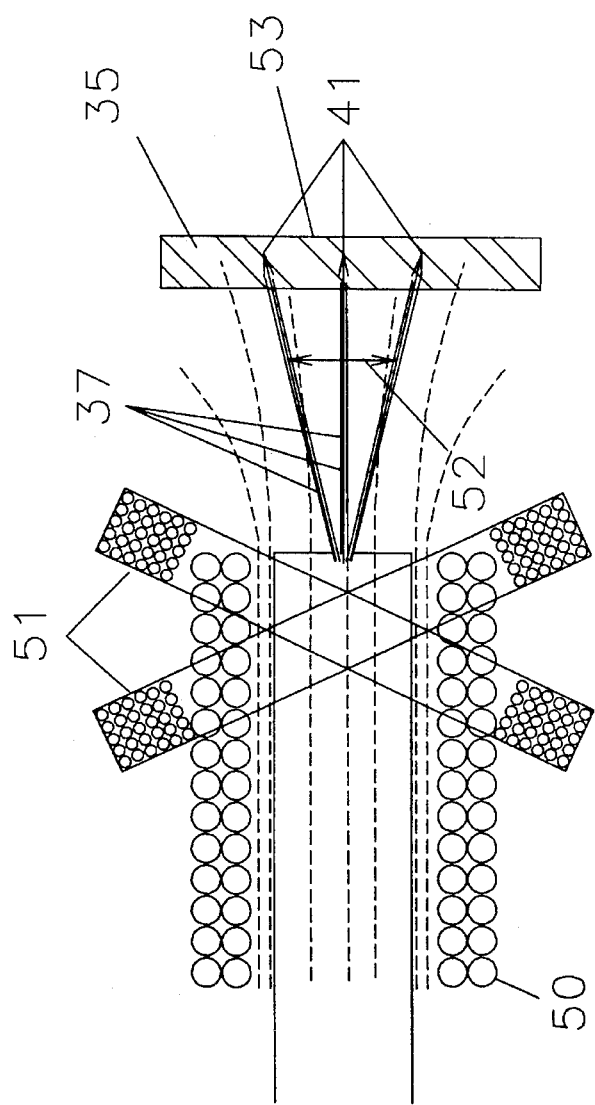
FIG. 3A is a schematic representation of the arc head welding embodiment in FIG. 2A showing an axial magnetic solenoid for arc column energy density enhancement and steering magnetic solenoids for arc column steering.

FIG. 3A shows one embodiment of the arc head 10 fitted with an axial magnetic solenoid 50 and steering magnetic solenoids 51. Applying an axial magnetic solenoid 50 to the arc head 10 greatly increases the arc column 37 energy density and as a result provides a variable melt zone 41 penetration depth capability to the arc head 10. Similarly, applying steering magnetic solenoids 51 to the arc head 10 enables the arc column 37 to be steered over the weld sample 35, and thus moving the location of the melt zone 41 through any 360° path 52 about the central axis 53 of the arc head 10 as illustrated in FIG. 3B.

Experience has shown that use of an axial magnetic solenoid 50 with the arc head 10 causes the arc column 37 voltage to rise, with this rise in voltage being a monotonic increase with increasing amp-turns in the axial magnetic solenoid 50. For example, an axial magnetic solenoid 50 of about 5,000 amp-turns results in an arc column 37 voltage increase of about 30% compared to the measured arc column 37 voltage for the arc head 10 operating at the same arc column 37 current, but without an axial magnetic solenoid 50. However, although the net input power into the arc column 37 is raised by about 30%, sectioning the resulting weld sample 35 and examining the melt zone 41 reveals that the volume of melt zone material increases by nearly 300%. This implied great increase in the energy density of the arc column 37 at the weld sample 35 is a direct result of entrapment of the arc column 37 electrons by the relatively strong axial magnetic field lines. This electron entrapment promotes a much higher degree of ionization of both the gas flow 15 from the arc head 10 and also the metal vapor products liberated from the melt zone 41. The net result of this process is a large increase in the arc column 37 energy density. This embodiment of the arc head allows the melt zone penetration depth to be varied during a welding run simply by controlling the magnetization current through the axial magnetic solenoid 50. Additionally, electron entrapment along the axis of the axial magnetic field lines keeps the arc column 37 oriented along this axis which means that the arc column 37 direction is well defined and well behaved with much less tendency for the arc column 37 to attach to sharp edges on the weld sample 35 that may be relatively far removed from the axis of the axial magnetic field.

Figure 3B:
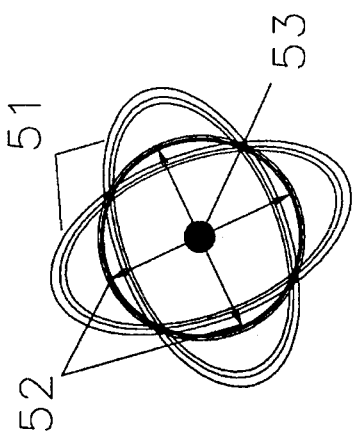
FIG. 3B shows the alignment of the magnetic fields.

The steering magnetic solenoids 51 shown in FIG. 3B deflect the arc column 37 by diverting the alignment of the magnetic field produced by the axial magnetic solenoid 50. With the steering magnetic solenoids 51 operating, the orientation of the net magnetic field is the vector sum of the separate magnetic field contributions from the axial magnetic solenoid 50 and the steering magnetic solenoids 51. By independent control of the magnetizing currents circulating through the steering magnetic solenoids 51, the arc column centerline 53 can be steered over a full 360° path 52 while the arc head 10 is traversing the length of a weld sample 35. This ability to steer the arc column 37 is advantageous for welding hard to reach corners and pockets in a weld work piece which might otherwise be difficult, or impossible, to weld properly due to mechanical interference with the weld head and/or arc column 37 line of sight problems. Moreover, this arc column 37 steering function can be performed extremely rapidly since the inductance of the steering solenoids 51 is relatively low, which enables very rapid changes in the magnetizing current levels in the steering solenoids 51 to be performed. This rapid sweeping function of the arc head 10 arc column enables different melt zone 41 heat input processes to be implemented to provide a metallurgical purer and stronger weld joint. Two steering magnetic solenoids 51 are shown in the embodiment to the arc head 10 shown in FIG. 3A, however, more steering magnetic solenoids 51 can be used, as required, to provide whatever steering of the arc column 37 is desired during welding with the arc head 10.

The magnetizing current required to provide the amp-turns necessary to provide a magnetic field adequate to substantially increase the arc column 37 energy density can be provided by routing the arc column 37 current from the arc run supply 36 through the axial magnetic solenoid 50. This procedure eliminates the need for a separate power supply for the axial magnetic solenoid 50. Moreover, routing the arc column 37 current through the axial magnetic solenoid 50 means that as the arc column 37 current increases, the axial magnetic field strength increases, and the arc column 37 energy density, and melt zone 41 penetration depth, increases. This process is ideal for welding thick metal samples where high arc column 37 currents and good melt zone 41 penetration depths are required.

Figure 3D:
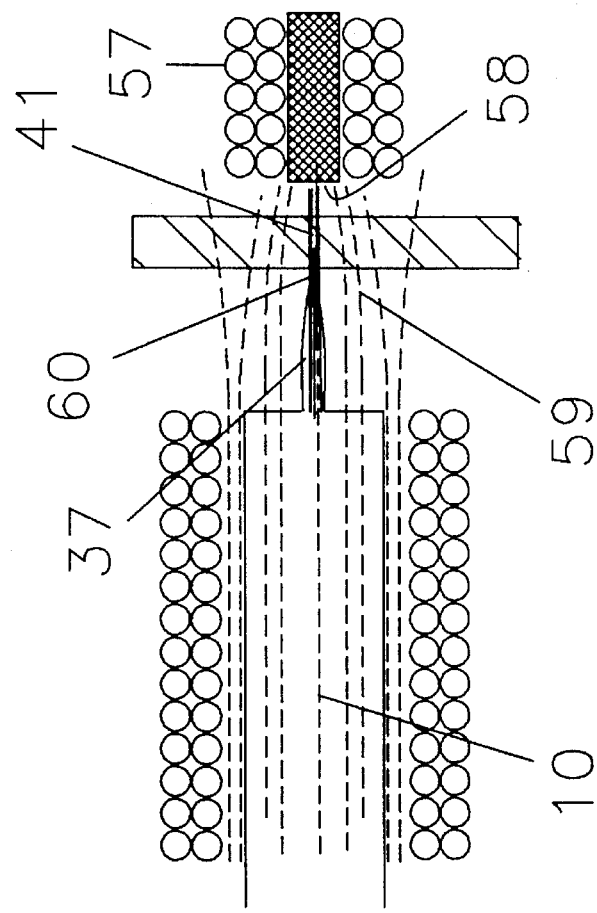
FIG. 3D is a schematic representation of flux concentrating solenoid used to further increase the arc column energy density and provide additional arc column steering functions over the arc head welding embodiment shown in FIG. 3A.
Figure 3C:
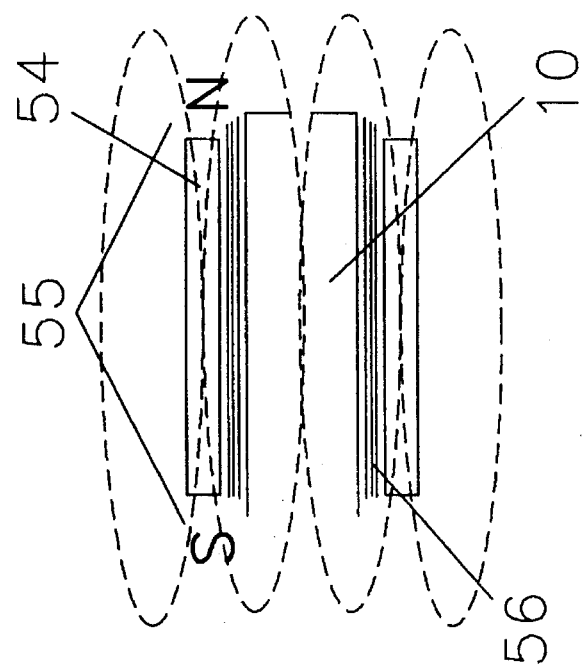
FIG. 3C is a schematic representation of the tubular magnet which could be used in place of the axial magnetic solenoid in FIG. 3A.

FIG. 3C shows an embodiment of the arc head 10 wherein the axial magnetic solenoid 50 has been replaced by a tubular permanent magnet 54 magnetized with dissimilar poles 55 at either end of the tubular permanent magnet 54. This embodiment of the arc head 10 is well suited for on-orbit welding applications since no electrical power is dissipated to maintain the magnetization of the tubular permanent magnet 54. To maintain a temperature below the Curie point of the material used in tubular permanent magnet 54 for on-orbit welding applications, it is necessary to use multiple layers of radiation foil 56 to minimize the transfer of heat energy from the arc head to this component.

In addition to the axial magnetic solenoid 50 and steering magnetic solenoids 51 shown in FIG. 3A, a flux concentrating solenoid 57 and pole piece 58 is also shown in FIG. 3D whose function is to further concentrate the magnetic field from the axial magnetic solenoid 50. With the magnetization of the flux concentrating magnetic solenoid 57 oriented to attract the lines of magnetic flux from the axial magnetic solenoid 50, these flux lines are further concentrated 59 to further confine 60 the arc column 37 and to further increase the arc column 37 energy density and thus the penetration depth of the melt zone 41. Provision is made for the flux concentrating solenoid 57 and pole piece 58 to move along beneath the weld sample 35 while the arc head 10 traverses the weld sample 35 so that these two components are aligned. Alternatively, both the arc head 10 and the flux concentrating solenoid 57 and pole piece 58 can be stationary and welding performed while the weld sample 35 is moved between them. Furthermore, movement of the flux concentrating solenoid 57 and pole piece 58 relative to the arc head 10 allows the arc column 37 to be steering over the weld sample 35. This results in the same potential benefits as ascribed to the steering magnetic solenoids 51.

Use of all or combinations of the axial magnetic solenoid 50, the steering magnetic solenoids 51, and the flux concentrating solenoid 57 and pole piece 58, allows the gap 34 over which the arc column 37 extends to be significantly longer than operation of the arc head 10 without any predominately axial magnetic fields. This behavior is a result of the helix 20 electrons being guided by the predominately axial magnetic fields to the weld sample 35. Moreover, this magnetic field electron guiding process allows the arc column 37 discharge to be established over relatively large gaps 34 at a well defined location on the weld sample 35.

A variety of schemes can be used to provide the magnetizing power to the various magnetic solenoids which can be used with the arc head 10 without having these solenoids overheat due to Ohmic heating, and due to their necessary close proximity to the hot arc head 10. Experience has shown that a coolant such as an ethyl-glycol-water mixture can be pumped directly through teflon insulated copper tubular windings, and that solenoids made using this winding and cooling technique can readily accommodate magnetizing currents of hundreds of ampere without overheating, or causing significant vacuum outgassing products. Similarly, experience has shown that a double walled cylindrical coolant jacket surrounding the arc head 10, through which an ethyl-glycol-water mixture is pumped, is adequate to provide simultaneous cooling of a many turn, tightly wrapped, square section insulator coated copper winding wrapped around this coolant jacket, and also to prevent significant heat transfer from the arc head 10 to this copper winding. Experience has also shown that it is desirable to have a high temperature electrical insulator such as alumina covering the downstream end of the axial magnetic solenoid 50 to ensure that this component, which can be mechanically coupled to the arc channel electrode 33 and can thereby be at the same potential as this electrode, does not become an arc attachment site for electrons to feed the arc column 37.

For on-orbit applications of the arc head 10, similar coolant schemes could be used for the various magnetic solenoids, however the coolant would be passed through a heat exchanger to radiate the heat energy picked up by the coolant to space. For on-orbit applications where a separate coolant supply, circulation system, and heat exchanger, would be too massive and bulky, such as astronaut hand held operation of the arc head 10, a cylindrical permanent magnet 54 could be used. Alternatively, the various arc head 10 magnetic solenoid embodiments could be fabricated using high temperature winding material with a high emissivity outer coating facing to space for radiant heat rejection, and with enhanced radiation foil 56 heat transfer insulation. These procedures would permit the arc head 10 to operate at a low duty cycle without the magnetic solenoids overheating.

Figure 4:
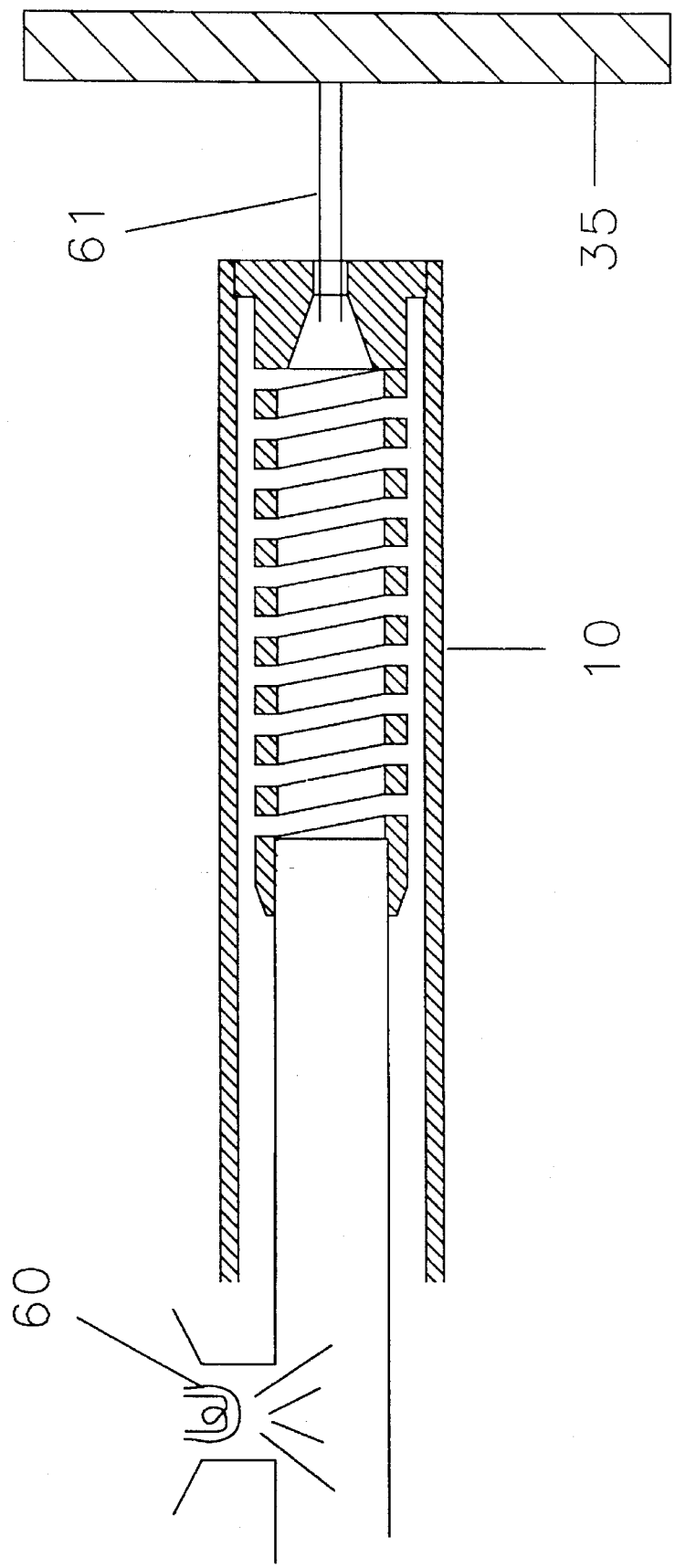
FIG. 4 is a schematic representation of the arc head in FIG. 1A showing how an auxiliary light source can be used to more accurately locate the arc column attachment site on a weld sample.

The arc head 10 helix 20 when heated to approximately 1,100 C. emits adequate light that this light, shining through the orifice plate 25 and the arc channel electrode 33, makes a diffuse illumination spot on the weld sample 35 which assists in aligning the melt zone 41 location on the weld sample 35 prior to the initiation of welding. FIG. 4 shows one embodiment of the arc head 10 whereby a light source 60 is fitted to the upstream end of the gas inlet/input current tube 13 to enhance this alignment process. The light from this light source 60 travels down the hollow axis of the arc head 10 and emerges from the tip of the arc head 10 to illuminate the weld sample with a thin pencil of light 61 which precisely locates the region of the weld sample 35 where the arc column 37 will attach too, and where the melt zone 41 will form. The light source 60 can be made to emit a color which is readily discernible on the weld sample 35. Moreover, the light source 60 can be made bright enough that the thin pencil of light 61 illuminates the weld sample 35, even after passing through the plasma discharge between the helix 20 and the arc channel electrode 33 when the arc head 10 is in a standby operating mode.

The arc head 10 can be operated in a modulated arc current mode at high frequency (several KHz) much the same as prior art TIG and plasma torches and vacuum hollow cathode arc welding sources, whereby the arc column current is rapidly varied from about 40% to 100% of its nominal steady state value of a couple of hundred ampere. However, unlike there prior art welding sources, the arc head 10 can also be operated from a repetitively discharged capacitor bank where peak arc column 37 currents can be of order several thousand ampere over an arc column 37 pulse length of order tens to hundreds of micro seconds.

Figure 5:
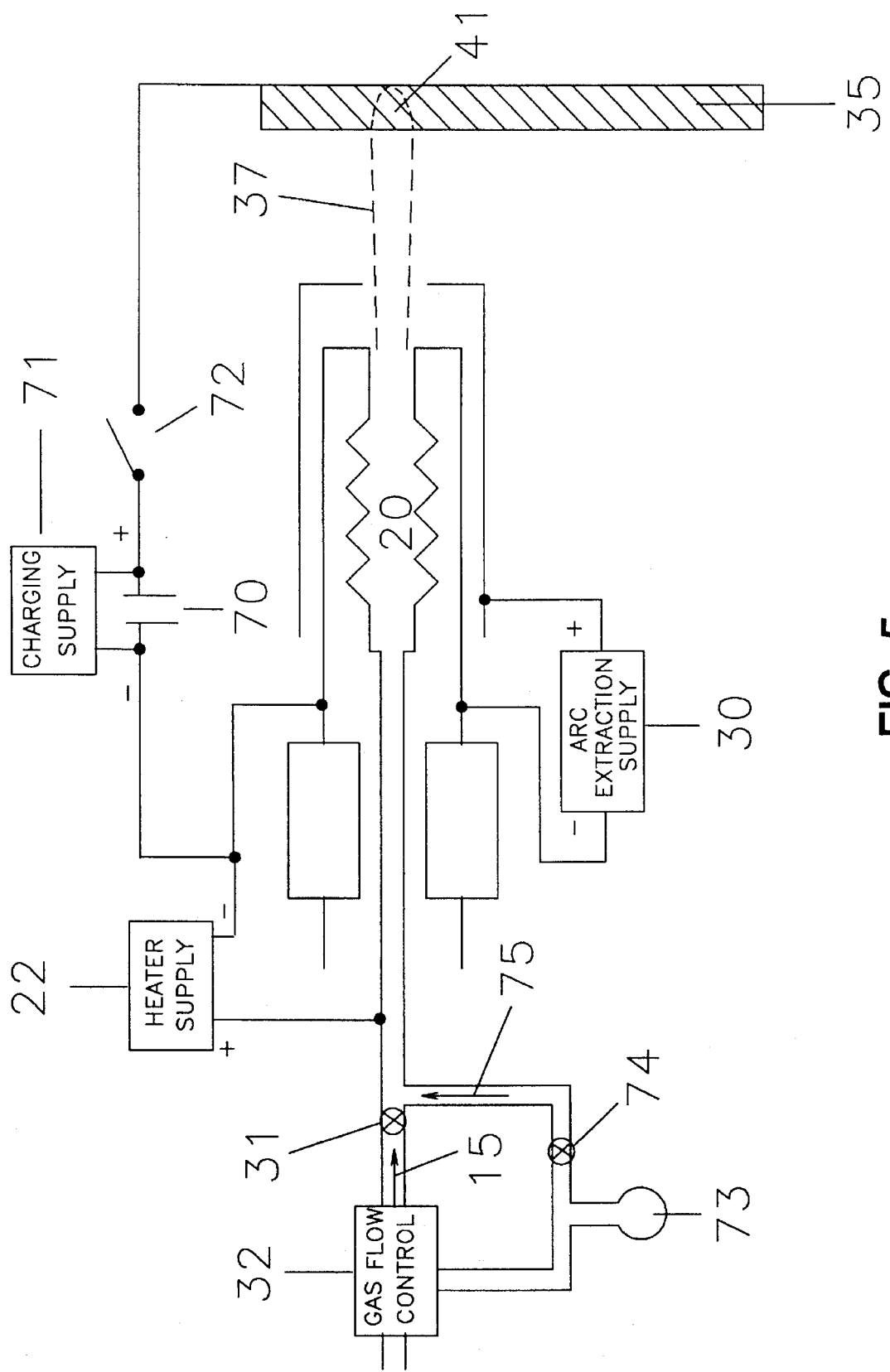
FIG. 5 is a schematic representation of the arc head welding embodiment in FIG. 2A showing a further embodiment for very high current pulse cyclic capacitor discharge welding.

FIG. 5 illustrates schematically this very high arc column 37 current pulsed mode embodiment of the arc head 10. The arc head 10 is started and placed in a standby operating mode as for steady state welding, with the low standby mode gas flow 15 being controlled by the gas flow controller 32, and with this gas flow 15 passing into the arc head 10 via the gas valve 31. A capacitor bank 70 is charged to a voltage typically of order 100–200 V by a direct current charging power supply 71. When the capacitor bank 70 has been virtually fully charged to a stored energy of order a few hundred Joule, a normally open switch 72 is closed and the capacitor bank 71 voltage is placed across the helix 20 and the weld sample 35. At approximately the same time as the switch 72 is closed, a precise volume 73 of relatively high pressure gas is admitted into the arc head 10 by opening the pulse valve 74. This sequence of events immediately initiates an arc discharge between the helix 20 and weld sample 35. The helix 20 is at a temperature of at least 1,100° C., and is a source for copious quantities of thermal electrons, while the relatively large volume pulse gas flow 75 provides a large quantity of gas atoms for ionization into a very high plasma density arc column 37 which is sustained by the very high current from the discharging capacitor bank 70. The net result of these processes is generation of an arc column 37 which has an extremely high energy density at its melt zone 41 attachment site on the weld sample 35. This high energy density causes virtually immediate melting of the weld sample 35 at the melt zone 41 during the extremely short arc column pulse.

When the energy in the capacitor bank 70 has been discharged through the arc column 37, the arc column 37 extinguishes, the switch 72 opens, and the capacitor bank 70 is recharged for the next pulse. The arc head 10 can readily provide arc column 37 current pulses of several thousand ampere and greater, because the helix 20 has a relatively low thermal mass, and a very large surface area for thermal electron emission. Moreover, the relatively high gas pressure, and resulting high plasma density around the helix 20, creates conditions ideal for field enhanced thermionic emission to occur, whereby the intense electric field in the plasma sheath adjacent to the helix 20 surfaces effectively lowers the electronic work function of the helix 20, which dramatically increases the electron current which can be drawn from the helix 20 at a given helix 20 temperature. This phenomenon is called the Schottky effect.

The very large pulse current of thousands of ampere passing through the arc column 37 from the discharging capacitor bank 70, generates a relatively strong self-induced azimuthal magnetic field around the arc column 37 which can pinch, or compress, the arc column 37, to further increase the arc column 37 plasma density, and the energy density of the arc column 37 at the melt zone 41.

The energy transferred from the capacitor bank 70 to the weld sample 35 is typically of order hundreds of Joule for an arc head 10 with a body/return current tube 14 outside diameter of 0.55". Depending on the type of material in the weld sample 41, a frequency of pulsing can be obtained whereby the energy delivered to the melt zone 41 per pulse, and the short time between pulses, is adequate to create a continuously molten melt zone 41. In effect, a continuous welding process occurs at the weld sample 41, even though the arc column 37 is only present for a very low duty cycle. Advantages to this type of welding are that the net heat energy transferred to the weld sample 41 is minimized, which avoids weld sample 41 distortion, and mitigates heat rejection concerns. Also, the very high arc column 37 energy density and very short pulse length, results in very rapid melting of the weld sample 41 which can be very beneficial for minimizing grain growth in the melt zone 41, and for improving the metallurgical properties and strength of the melt zone 41. Additionally, the power system for the arc head 10 very high current pulse embodiment is relatively simple in that it consists of only a capacitor bank 70, a simple charging supply 71, and a switch 72. Since the pulse frequency, charging voltage, and pulse energy, can be changed readily with this configuration of components, it also means that very precise control can be exerted on the heat energy transferred to the melt zone 41, which thus enables very precise welding operations to be performed.

As in steady state welding with the arc head 10, where the arc column 37 current can be routed through from the arc run supply 36 through the axial magnetic solenoid 50, the very large pulse current from the discharging capacitor bank 70 can be routed through the axial magnetic solenoid 50. This very large current pulse produces a very large axial magnetic solenoid 50 magnetic field which further increases the arc column 37 plasma density and the energy density of the arc column 37 at the melt zone 41. Moreover, routing the arc column 37 current pulse through the axial magnetic solenoid 50 also further enhances the self-induced azimuthal magnetic field arc column 37 pinching process.

The arc head 10 can function as its own switch 72 in the current pulse mode embodiment. To perform this function, the insert/heater/orifice plate 11 is brought to a temperature of approximately 1,100° C. so that the helix 20 is a source of copious quantities of thermal electrons. However, the arc channel electrode 33 arc discharge is off so that no plasma exists between this component and the helix 20. Under these conditions, the full capacitor bank 70 voltage can be placed between the helix 20 and the weld sample 35 without a plasma discharge occurring. Relatively low current (several tens of ampere), and relatively low energy (several Joule) positive voltage pulses applied to the arc channel electrode 33 relative to the helix 20 create a plasma discharge between the helix 20 and the arc channel electrode 33 producing a plasma jet which is injected into the gap 34. The momentary presence of this highly conducting plasma jet in the gap 34 fires the capacitor bank 70, creating a very high current arc column 37 pulse from the helix 20 to the melt zone 41. The voltage pulse applied to the arc channel electrode 33 is sequenced so that the energy in this pulse is nearly extinguished as the very high current arc column 37 is initiated. This self-triggering capability of the arc head 10 avoids the need of a high current switch 72 (such as a Silicon Controlled Rectifier) which must be sized to have a peak current and energy rating adequate to pass the entire discharging capacitor bank 70 energy. The omission of this large, heavy and costly part, along with its attendant control circuitry, is particularly important for on-orbit applications of a very high current pulsed arc head 10, where minimum mass and complexity are important.

Figure 6A:
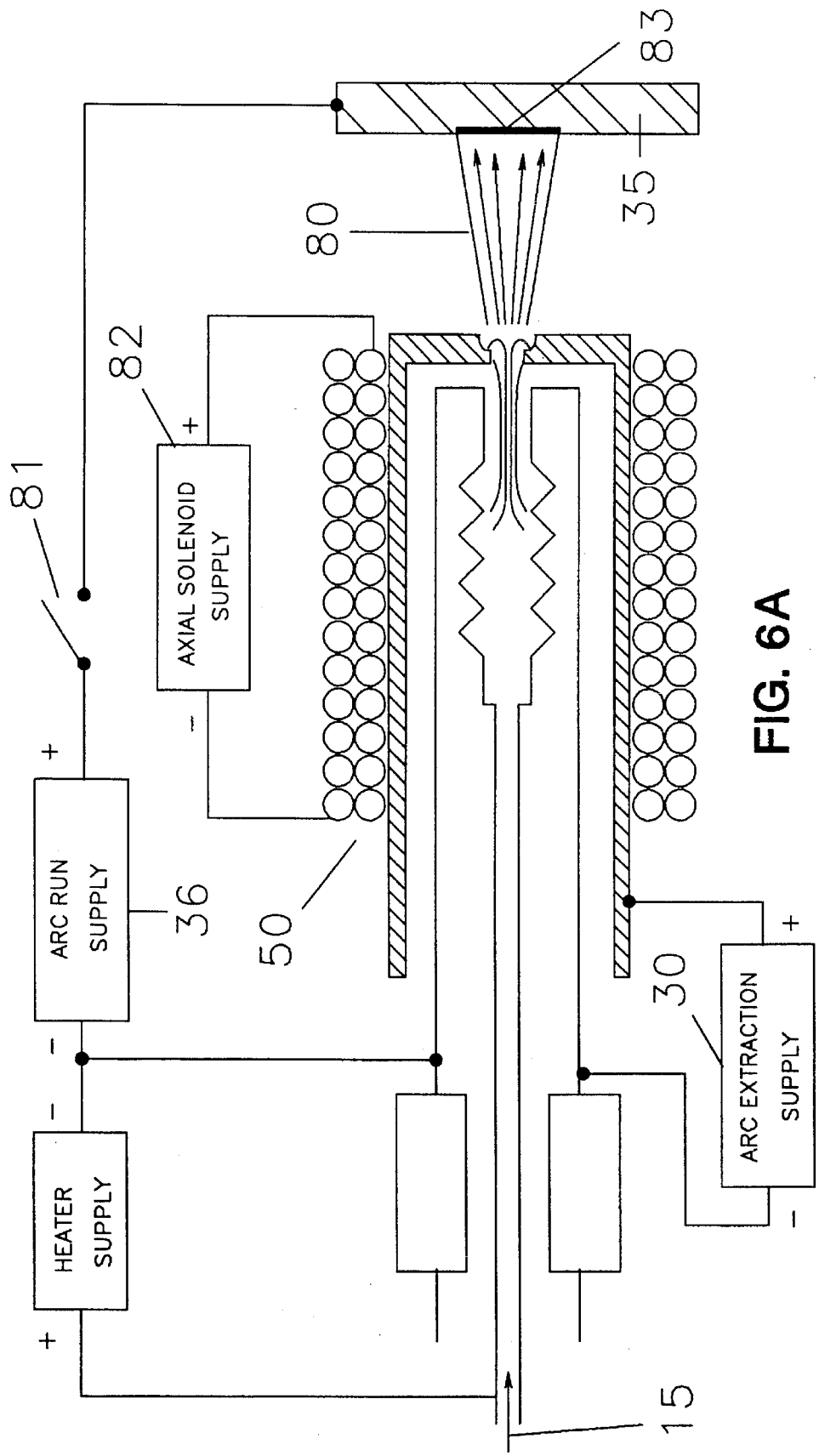
FIG. 6A is a schematic representation of the welding embodiment of the arc head in FIG. 3A showing a further embodiment of the arc to produce an accelerated plasma plume for removing oxides from aluminum weld sample surfaces.

FIG. 6A shows the arc head 10 configured to produce an accelerated plasma plume 80 for surface cleaning of the weld sample 35 prior to coupling the arc column 37 to the weld sample 35 for welding. Surface cleaning is particular important for materials such as aluminum which always have an oxide layer on their surface. These oxide layers act like a sponge for contaminants, in addition to presenting a high resistivity surface coating on the aluminum which inhibits reliable arc column 37 attachment. The arc head 10 is configured for surface cleaning by disconnecting the arc run supply 36 from the weld sample by a switch 81, turning on the axial magnetic supply 82 to provide at least 5,000 amp-turns to the axial solenoid 50, adjusting the gas flow 15 to a value intermediate between the standby mode of arc head 10 operation and the steady state welding mode of arc head 10 operation, and increasing the arc extraction supply 30 current to a value several times the arc head 10 standby mode operating current. Under these conditions, an accelerated plasma plume 80 exits the arc head and impinges 83 on the weld sample 35.

Figure 6B:
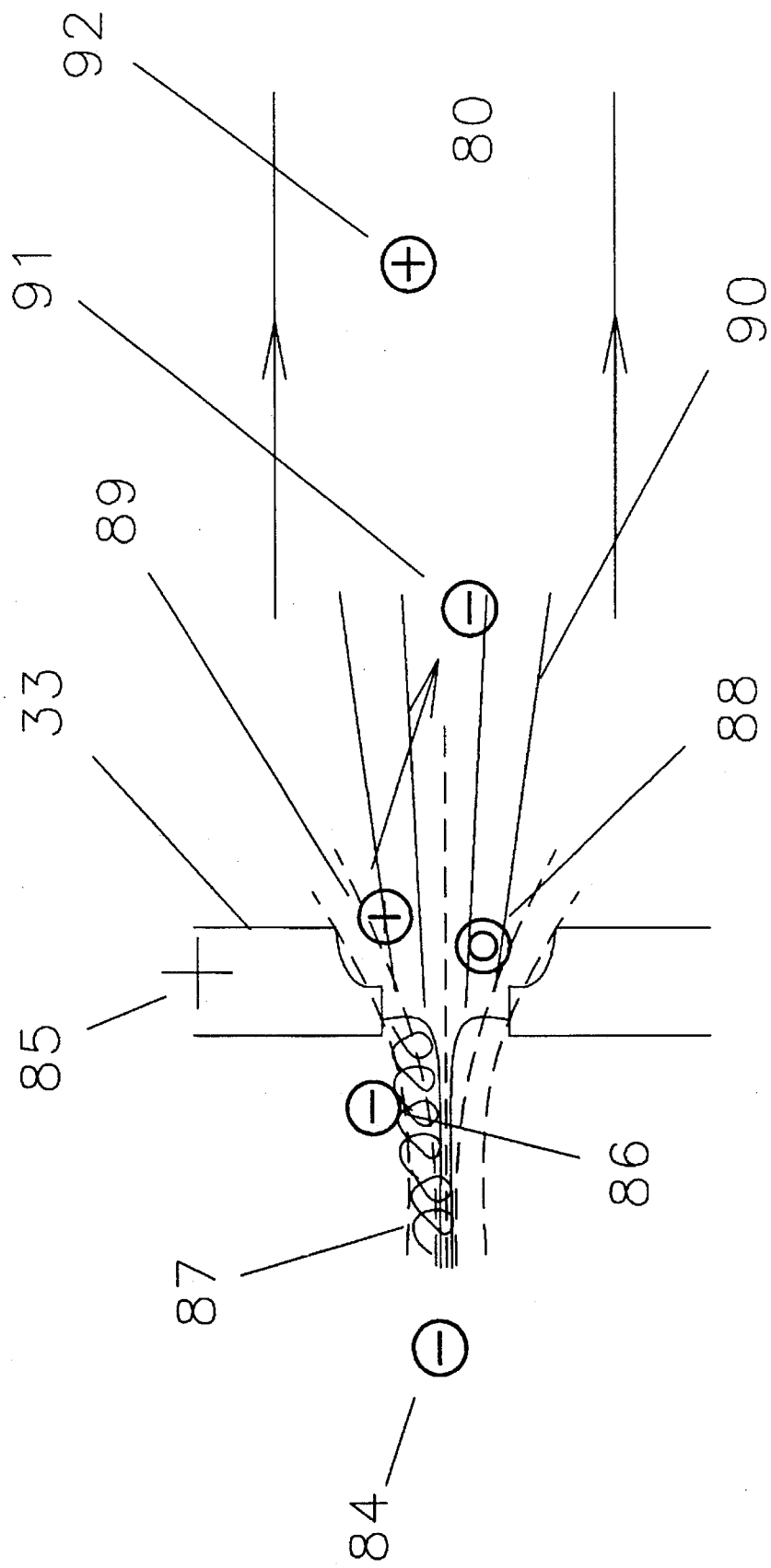
FIG. 6B is a schematic representation of the mechanism used to produce an accelerated plasma plume in the arc head embodiment shown in FIG. 6A.

The mechanism for producing the accelerated plasma plume 80 is shown schematically in FIG. 6B. The accelerated plasma plume 80 is produced by electrons 84 emitted from the helix 20 which are attracted to the positive potential 85 of the arc channel electrode 33. These electrons spiral 86 along the slightly diverging magnetic field 87 from the axial magnetic solenoid 82 where they undergo inelastic collisions with neutral gas atoms 88 to create ions 89 as they work their way across the diverging magnetic field 87 to the arc channel electrode 33. A small fraction of electrons leaving the helix 20 are trapped on the strong magnetic flux lines which are oriented directly downstream from the arc head 10 along the arc head 10 axis 90. These axially oriented electrons 91 create a virtual cathode along the arc head 10 axis 90 which results in a potential gradient from the arc channel electrode 33 to the arc head axis 90 which has a substantial component directed downstream of the arc head 10. The ions 89 are accelerated by this component of the potential gradient and leave the arc head 10 in a fairly well directed plume 80. These accelerated ions 92 are accompanied by an equal number of axially directed electrons 91 by ambipolar diffusion processes which results in a space-charge neutral plasma plume 80 leaving the arc head 10.

The accelerated ions 92 impinge 83 upon the weld sample 35 and remove surface oxide coatings by sputtering. Accelerated ion 92 energies are several tens of volts, and flux levels impinging 83 upon the weld sample 35 are a few amp/cm$^2$, which allows for sputter removal of weld sample oxide coatings at arc head travel speeds commensurate with typical welding travel speeds. Immediately upon cleaning the weld sample 35, the arc head electrical and gas systems can be remotely reconfigured, and the arc run supply 36 switch 81 closed, to initiate welding on the weld sample 35 directly over the previously cleaned welding surfaces.

The arc head 10 can be used to perform welding on weld samples 35 without any electrical connection between the arc head 10 and the weld samples 35. To weld in this mode, the arc head 10 is configured to produce an accelerated plasma plume 80 similar that used for weld sample 35 surface cleaning. However, the amp-turns in the axial solenoid is increased to more than 10,000 amp-turns, the gas flow 15 is increased over its surface cleaning value to a few tens of standard cubic centimeters per minute, and the arc extraction supply 30 current is increased to a few tens of ampere. Under these conditions, the accelerated plasma plume is energetic enough to form a well defined melt zone 41 on the weld sample for welding functions to be performed. Pulsed operation of the arc extraction supply 30, the axial solenoid supply 82, and the gas flow 15, can also be implemented to provide a pulsed accelerated plasma plume 80 to achieve similar weld sample 35 surface cleaning and weld sample 35 welding functions.

The accelerated plasma plume embodiment of the arc head 10 in FIG. 6A and FIG. 6B is useful also for application of the arc head 10 as a plasma contactor for the discharging of charged spacecraft surfaces via the transfer of charged particles from the arc head 10. Also, the accelerated plasma plume embodiment of the arc head 10 is useful as a source of low thrust for spacecraft minor attitude and orbit adjustments.

A further method of weld sample 35 surface oxide cleaning may be implemented with the arc head 10 whereby a reducing gas is used in the arc head 10. This oxide cleaning procedure can involve configuring the arc head 10 to produce an accelerated plasma plume 80 whereby hydrogen gas, or a hydrogen/argon gas mixture, is used so that free hydrogen ions are available to react chemically with the weld sample 35 surface oxides to reduce these oxides and thus provide a chemically enhanced sputter cleaning process. Pure chemical reduction of weld sample 35 surface oxide coatings can also be achieved by using a hydrogen, or argon/hydrogen gas mixture, in the arc head 10 while using the arc head in a normal welding configuration whereby the arc column 37 current is high enough to heat the weld sample 35 surface to a temperature just below its melting temperature. This temperature level being high enough to cause a vigorous hydrogen ion/atom reduction reaction on the oxide coating on the weld sample 35 surface.

In addition to these specific oxide surface cleaning embodiments, the arc head 10 may also be operated using prior art variable polarity and variable arc column 37 current and variable frequency arc run supply 36 operating modes, which are well known to result in oxide and surface cleaning of aluminum weld samples 35.

FIG. 7A shows one embodiment of the arc head configured for use as a metal vapor deposition system. In this embodiment, the arc head 10 is started and placed in a standby operating mode using the arc extraction electrode 33. Adjoining the arc head 10 is a crucible 90, with an evaporation chamber 91 whose downstream end necks down to a throat exit 92 which is followed by a diverging expansion nozzle 93. At the upstream end of the evaporation chamber 91 an anode biased wire 94 is inserted whose feed rate is controlled by a variable speed reel 95 onto which a large length of the anode biased wire 94 is wound. The crucible 90 is made from a high metal temperature insulating material which is chemically inert to most molten metals such as boron nitride.

FIG. 7B shows schematically how the metal vapor deposition process is initiated by feeding the anode biased wire 94 through the throat 92 and past the diverging expansion nozzle 93 until a stable arc plasma 96 can be established from the emitter 20 to the tip 97 of the anode biased wire 94. Once this stable arc plasma 96 has been established, the variable speed reel 95 winds the anode biased wire 94 back into the crucible 90 to a location within the evaporation chamber 91. The arc run supply 36 current is then increased to increase the power into the anode biased wire 94 to initiate melting of the tip 97. Simultaneously with the onset of this melting, the variable speed reel 95 is unwound to keep the anode biased wire 94 tip 97 at approximately the same location within the evaporation chamber 91. The crucible 90 rapidly heats to a temperature above that required to allow condensation of the metal vapor 98 emitted from the anode biased wire 94 tip 97. Furthermore, the metal vapor 98 rapidly increases the pressure in the evaporation chamber 91, causing the metal vapor 98 to be ejected at high thermal energy through the throat 92 and into the diverging expansion nozzle 93 where the random velocity components of the metal vapor 98 particles are oriented to produce a fairly well directed metal vapor jet 99 for deposition onto the surface 100 of a suitable target 101.

The thermal energy absorbed by the crucible 90 can be more effectively maintained by wrapping high temperature insulation 102 around the outer surfaces of the crucible 90. This enables the heat energy in the crucible 90 to be effectively transferred back into the anode biased wire 94 to preheat the anode biased wire 94, which reduces the overall power in the arc plasma 96 to maintain the metal vapor deposition process.

Control of the rate of deposition onto the target 101 surface 100 can be effected by controlling the power of the arc plasma 96 coupled from the arc head 10 to the anode biased wire 94. As the arc plasma 96 power increases, the evaporation rate of the anode biased wire 94 increases which requires that the feed rate of the anode biased wire 94 into the evaporation chamber 91 from the variable speed reel 95 has to increase to maintain the tip 97 at approximately the same position within the evaporation chamber 91. A wide range of pure metal elements and alloys can be used as the anode biased wire feed 94 to produce a wide range of deposition products 100 on the target 101. Since there is no electrical connection between the arc head 10 and crucible 90, and the target 101, the target 101 can be either a conductor or an insulator. Uniform coating of the target is accomplished by either moving the arc head 10 and crucible 90 over the target 101, or moving the target 101 beneath the arc head 10 and crucible 90. Multiple arc heads 10 and crucibles 90 can be used to produce more uniform coating of large area targets 101 and also to increase the overall rate of deposition 100 on the targets 101. Similarly, the arc run supply 36 can be configured to provide either a continuous arc plasma 96, or a pulsed arc plasma 96.

An arc head 10 and crucible 90 can be used to put deposits 100 on weld samples 35 to aid in metallurgical bonding of dissimilar metal weld samples 35 by the arc head 10 when it is configured for welding applications. Similarly, an arc head 10 and crucible 90 can be used to maintain a prescribed rate of deposit 100 of a metal, or alloy, onto a weld sample 35, consisting of similar or dissimilar metals, for the purposes of metal mixing for improving metallurgical bonding and the weld strength properties, while another arc head 10, configured for welding, is used to weld these weld samples 35.

The metal vapor deposition embodiment of the arc head 10 is particularly important for on-orbit applications since the flow rate or argon gas is very low to sustain the process, and the deposition rate of the metal vapor is very high. This high metal deposition rate means that this arc head embodiment is well suited to refurbishing metal reflective surfaces important on spacecraft and equipment for on-orbit thermal radiation control.

The arc head 10 can be operated on a variety of gases. Specifically, operation of the arc head 10 on nitrogen, and then using a titanium anode biased wire 94, creates an environment in the evaporation cavity 91 and the diverging nozzle 93 which allows for the formation of titanium nitride. This embodiment of the arc head 10 to provide a copious source of titanium nitride is extremely useful for laying down coating which have excellent wear resistance. Other combinations of gases and anode biased wires 94 can be used to create a multiplicity of possible coatings which have innumerable potential applications.

Figure 8:
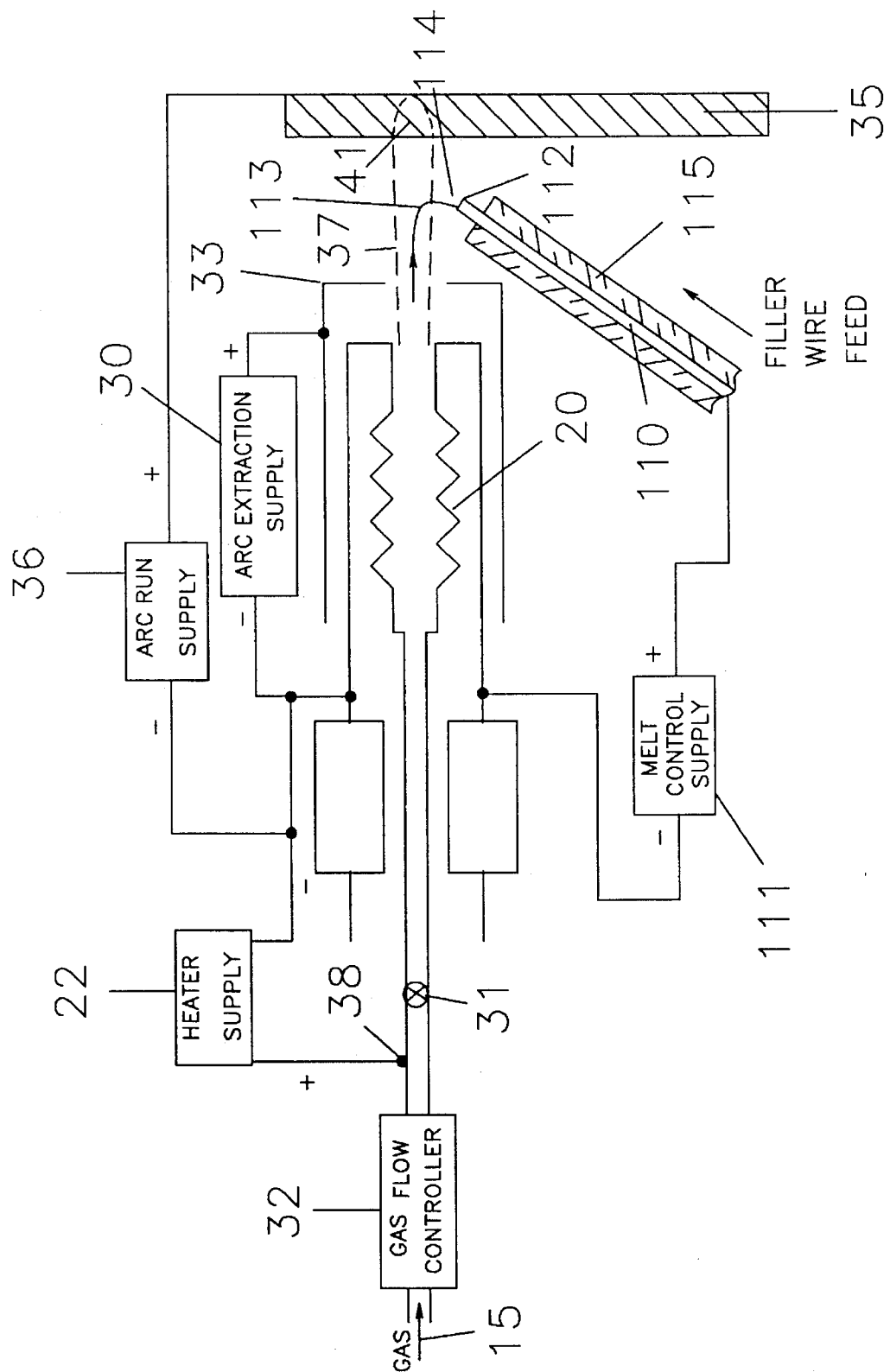
FIG. 8 is a schematic representation of the arc head embodiment in FIG. 2B showing a method of filler wire incorporation into the melt zone.

FIG. 8 shows another embodiment of the arc head 10 wherein filler wire 110 can be used to add molten material to the melt zone 41. Use of filler wire 110 is well known for a wide variety of prior art welding techniques. The arc head 10 can be used with filler wire 110 wherein the filler wire 110 is placed in the arc column 37, or close to the melt zone 41, such that thermal transfer to the filler wire 110 is great enough to promote melting of the filler wire 110 and incorporation of the filler wire 110 into the melt zone 41. In addition, as shown in FIG. 8, the filler wire 110 can be electrically connected to the positive output of a melt control power supply 111 with the negative output of the melt control power supply connected to the negative output of the arc run supply 36. The melt control power supply 11 is current regulated and draws a portion of the arc column 37 for the attachment to the tip 112 of the filler wire 110. The melt control current 113 can be set by the melt control power supply 111 to a level which ensures vigorous heating and melting of the filler wire 110, an subsequent transfer and incorporation of the filler wire 110 into the melt zone 41. Very large rates of incorporation of the filler wire 110 into the melt zone 41 can be accomplished by increasing the melt control current 113 and the separation gap 114 between the tip 112 of the filler wire 110 and the arc column. Similarly, very precise control of the rate of incorporation of the filler wire 110 into the melt zone 41 can be accomplished by precise control of the melt control current 113 for a given separation gap 114. The filler wire 110 may be fed into the region near the arc column 37 using well known prior art filler wire 110 feed techniques. It is important that the filler wire 110 pass through a high temperature electrically insulating tube 115 in the region near the arc column 37 so that only the tip 112 of the filler wire 110 is exposed to the arc column 37. The insulating tube 115 may be fabricated from a material such as pyrolytic boron nitride.

On-orbit applications of the arc head 10 and its many embodiments can be made more convenient by using a battery system as a primary power source. Use of a battery power system electrically isolates the plasma discharges typical of the arc head 10 from the internal power system of Space Station, or other comparably strategic space based assets, and also provides portability of the system without the need for long and heavy umbilical power and control cables. The relatively low duty cycle operation of the arc head for on-orbit applications mean that a small, highly electrically isolated, charging power supply can be connected from the Space Station power system to provide a continuous trickle battery charging function to the arc head battery power system. Moreover, if the battery voltage is always higher than the maximum arc column 37 voltage during peak power arc head 10 welding operations, a simple transformerless, highly efficient, current regulator circuit can be used to control the arc column current directly from the battery system.

For on-orbit applications, the arc head and its embodiments, can be robotically controlled for plate, structural, or tube welding applications. In addition, the small size, low mass, and non-lethal potentials of the arc head also make it ideal for direct manipulation by astronauts as a versatile, hand held, all metal working tool.

I claim:

1. A safe potential arc channel enhanced arc head comprising:

means for introducing a gas flow ionizable to produce a plasma, the gas flowing from a location generally at an upstream end of the arc head into an electrically conducting gas inlet and input current tube coaxially assembled to a generally tubular, electrically conducting insert heater orifice plate;

means for aligning the gas inlet and input current tube and the insert heater orifice plate to share a common axis aligned with the direction of gas flow, the insert heater orifice plate having an orifice therein through which the gas flow exits the arc head;

means for forming a joint at a downstream end of the insert heater orifice plate and a downstream end of an electrically conducting body and return current tube;

a tube coupler electrical insulator generally tubular in shape and means for attaching an upstream end of the body and return current tube to the downstream end of the tube coupler electrical insulator and for attaching an upstream end of the tube coupler electrical insulator to an upstream end of the gas inlet and input current tube;

means for aligning the tube coupler electrical insulator and the body and return current tube to share a common axis, the common axis being coaxial with the common axis of the gas inlet and input current tube and the insert heater orifice plate which are contained wholly within, and electrically isolated from, an inside diameter of the tube coupler electrical insulator and the body and return current tube except at the joint between the insert heater orifice plate and the body and return current tube;

means for establishing a potential difference between an upstream end of the gas inlet and input current tube and an upstream end of the body and return current tube to produce a heater current flow in a path from the upstream end of the gas inlet and input current tube, through the insert heater orifice plate, and through the body and return current tube to the upstream end of the body and return current tube;

resistance means for making an Ohmic resistance integral to the insert heater orifice plate at least three times higher than an Ohmic resistance of the current path through the gas inlet and input current tube and the body and return current tube, said resistance means comprising one or more helixes, each with a multiplicity of turns, generally located between an interface between the gas inlet and input current tube and an upstream end of the insert heater orifice plate, the insert heater orifice plate comprising porous tungsten, having a density within the range 70%–90%, and the one or more helixes being impregnated with a low electronic work function emissive mix material;

first power supply means for providing variable control of a heater current to enable heating the one or more helixes to a temperature of at least 1100 degrees C. for normal arc head operation and to a higher temperature for rapid arc head start-up and self-cleaning;

thermal insulation positioned outside of the body and return current tube from a location at a downstream end of the insert heater orifice plate to a location generally at the upstream end of the insert heater orifice plate.

2. An arc head as in claim 1, further comprising:

an electrically conducting arc channel electrode positioned downstream from the downstream end of the insert heater orifice plate, a downstream portion of the arc channel electrode being tapered;

second power supply means for applying a positive potential to the arc channel electrode and a negative potential to the upstream end of the body and return current tube;

a generally circular channel within the arc channel electrode incorporating a diameter not less than one-half, and not more than six times, a diameter of the insert heater orifice plate orifice;

means for coaxially assembling and electrically isolating the arc channel electrode with the arc head so that the arc head body and return current tube lies within an inside diameter of the arc channel electrode, and means for ensuring that predominantly all gas flow from the arc head passes through the arc channel electrode channel;

means for separating the upstream end of the channel electrode from the downstream end of the insert heater orifice plate by a distance at least equal to one eighth of the diameter of the insert heater orifice plate orifice;

means for shaping the arc channel electrode channel to be non-circular and to include tapering the channel from a larger diameter to a smaller diameter in the direction of gas flow, expanding the channel from a small diameter to a larger diameter in the direction of gas flow, to thereby effect changes in the pressure of the gas flow and in a plasma density, voltage, and energy density of an arc column drawn from the helix through the arc channel electrode channel; and additional thermal insulation positioned outside the arc channel electrode form a location generally at an upstream end of the arc channel electrode to a location generally at the upstream end of the insert heater orifice plate.

3. An arc head as in claim 2, further comprising:

an arc run power supplying a positive potential to an electrically conducting, generally metallic weld work piece, and a negative potential to the upstream end of the body and return current tube, the arc column from the helix to the arc channel electrode being drawn to the weld work piece, the arc run power supply providing a variable current to increase the arc column current to a level at which significant melting occurs in a melt zone at the weld work piece, the melt zone being employed for continuous welding, cutting, and shaping purposes by moving a select one of the arc head and weld work piece relative to each other, the melt zone being employed for spot welding processes by maintaining the arc head and weld work piece stationary with respect to each other for a precisely timed duration of the arc run supply current;

the arc run power supply being operative in a variable duty cycle, variable polarity mode, and in a variable frequency, variable arc column current magnitude mode; and gas flow control means for providing a multiplicity of gas flow control levels of a weld process gas, including a minimum gas flow for a standby arc head operation mode, and larger steady state gas flow levels for various arc head and arc run power supply modes.

4. An arc head as in claim 3, further comprising:

an axial magnetic solenoid comprising multiple turns of a highly conducting wire, the axial magnetic solenoid being assembled coaxially with the arc channel electrode and the arc head so that the arc channel electrode lies within an inside diameter of the axial magnetic solenoid, the axial magnetic solenoid being positioned such that a downstream end thereof is generally at an exit of the arc channel electrode channel and an upstream end thereof is generally at a downstream end of the tube coupler electrical insulator, the axial magnetic solenoid producing a generally axial magnetic field along the length of the arc column to substantially increase the arc column plasma density and voltage, and to thereby substantially increase the arc column energy density transferred to the weld work piece;

third power supply means for providing a variable direct magnetizing current to the axial magnetic solenoid to provide a controllable energy density of the arc column at the melt zone in the weld work piece, resulting in a controllable melt zone penetration;

an electrical and thermal insulator covering a downstream end of the axial magnetic solenoid;

a coolant supply means to remove excess heat from the axial magnetic solenoid, the axial magnetic solenoid including high emissivity coatings on outside surfaces thereon to aid in radiative heat removal from the axial magnetic solenoid.

5. An arc head as in claim 4, wherein the arc column current provided by the arc run power supply is routed through the axial magnetic solenoid to simultaneously provide both the magnetizing current for the axial magnetic solenoid and the arc column current.

6. An arc head as in claim 3, further comprising a tubular permanent magnet, magnetized along its axis with single, but unlike poles at either end thereof, the tubular permanent magnet being aligned coaxially with the arc channel electrode such that the arc channel electrode lies within an inside diameter of the tubular permanent magnet and such that a downstream end of the tubular permanent magnet lies generally at a location of an exit of the arc channel electrode channel, and such that an upstream end of the tubular permanent magnet lies generally at a location of a downstream end of the tube coupler insulator.

7. An arc head as in claim 4, further comprising magnetic flux concentration means provided generally opposite and beneath the weld work piece from the melt zone, the magnetic flux concentration means comprising a high permeability pole piece positioned with respect to the magnetic pole of the axial magnetic solenoid to concentrate the magnetic flux along the arc column, into the melt zone, and through the weld work piece.

8. An arc head as in claim 7, further comprising means to move the magnetic flux concentration means relative to an axis of the arc head and to thereby move the arc column and melt zone relative to the axis of the arc head.

9. An arc head as in claim 4, further comprising a multiplicity of steering magnetic solenoids positioned generally toward the downstream end of the arc channel electrode to steer the arc column by the action of magnetic fields, produced by the steering magnetic solenoids, whose combined axis is different from the arc head axis, the magnetic fields being rapidly variable to rapidly steer the arc column and the melt zone, over the weld work piece, as the arc head and the weld work piece are translated relative to each other.

10. An arc head as in claim 3, further comprising a light source provided at the upstream end of the gas inlet and input current tube, the light source being operative for propagating a beam of intense light along a central axis of the arc head and through the arc channel electrode channel to illuminate a visible spot on the weld work piece corresponding to a projection of the arc head central axis onto the weld work piece, and corresponding to a melt zone initiation location during a welding operation.

11. An arc head as in claim 4 wherein the arc run power supply comprises:

a capacitor bank having a negative terminal connected to the upstream end of the body and return current tube and a positive terminal connected to the weld work piece, the capacitor bank being repetitively discharged to produce a peak arc column current of at least several thousand amperes; and a charging supply and a triggering circuit arranged to provide arc column pulsing at frequencies controllable from 0.01 Hz to 10,000 Hz.

12. An arc head as in claim 11 wherein the gas flow control means includes means for providing a gas flow pulse precisely timed to coincide with the arc current pulse resulting from discharging the capacitor bank.

13. An arc head as in claim 11 further comprising means for routing the arc current pulse resulting from discharging the capacitor bank through the axial magnetic solenoid and the arc head to simultaneously supply both the arc column current and the magnetizing current for the axial magnetic solenoid.

14. An arc head as in claim 11 further comprising means for triggering a discharge of the capacitor bank by employing the arc head as a fast acting, high current plasma switch by maintaining the helix at or above 1100 degrees C. and pulsing on a helix-to-arc channel electrode plasma discharge to create a conducting plasma bridge between the arc head and the weld work piece.

15. An arc head as in claim 11 further comprising means for selectively establishing one of a steady state plasma discharge and a pulsed plasma discharge between the helix and the arc channel electrode while the axial magnetic solenoid is operated at greater than 5,000 amp-turns, and means for selecting one of a steady state magnetizing current and a pulsed magnetizing current, to thereby produce an accelerated plasma plume emanating from the arc channel electrode.

16. An arc head as in claim 15 further comprising means for routing the current to establish the helix-to-arc channel electrode discharge through the axial magnetic solenoid to provide the magnetizing current for the axial magnetic solenoid and also the current for the helix-to-arc channel electrode discharge.

17. An arc head as in claim 16 further comprising means for employing the accelerated plasma plume for cleaning oxide coatings and surface contaminants from the weld work piece prior to welding.

18. An arc head as in claim 3, further comprising means for blending a chemically reducing gas with the gas flow to enable oxide cleaning from the surfaces of the weld work piece.

19. An arc head as in claim 2 further comprising:

an electrically insulating crucible positioned outside an outer diameter of the arc channel electrode, the crucible comprising an evaporation chamber, a downstream end of which is closed down to a throat having a diameter not greater than a largest diameter of the evaporation chamber, the crucible further comprising a diverging nozzle, downstream of the throat, the diverging nozzle terminating in an exit diameter that is not less than the throat diameter;

variable rate wire feed means for feeding a conducting wire into an upstream opening of the crucible and into the evaporation chamber;

variable power supply means for establishing a positive potential on the conducting wire and a negative potential on the body and return current tube;

means for coupling a plasma discharge between the helix and the arc channel electrode to the conducting wire;

means for increasing input power to the variable power supply means to vigorously melt the tip of the wire in the evaporation chamber, while simultaneously maintaining the wire feed means to maintain a tip of the conducting wire generally in the center of the evaporation chamber, and to thereby produce copious quantities of metal evaporant products; and means for mechanically positioning the arc head and the crucible to direct metal evaporant products emanating from the diverging nozzle to a select one of substrates and weld work pieces downstream of the crucible.

20. An arc head as in claim 19 further comprising means for providing a variable frequency, high current capacitor discharge pulse to create a plasma discharge between the conducting wire and the body and return current tube.

21. An arc head as in claim 19, further comprising a second arc head employed to weld the weld work piece simultaneously with the deposition of evaporant products on the melt zone from the crucible.

22. An arc head as in claim 4, further comprising a battery power source means to provide power to operate the arc head.

23. An arc head as in claim 3, further comprising a melt control power supply means, a positive terminal thereof being connected to a fed filler wire and a negative terminal thereof being connected to the negative potential of the arc run power supply, a melt control current being drawn from the arc column to a tip of the fed filler wire to melt the fed filler wire, the melt control power supply means including a melt control current control to precisely control the rate of melt of the fed filler wire and a resultant incorporation into the melt zone, the fed filler wire passing through an electrical insulator tube such that only the tip of the fed filler wire is exposed to the arc column.

* * * * *

UNITED STATES PATENT AND TRADEMARK OFFICE
CERTIFICATE OF CORRECTION

PATENT NO. : 5,587,093
DATED : December 24, 1996
INVENTOR(S) : Graeme Aston

It is certified that error appears in the above-indentified patent and that said Letters Patent is hereby corrected as shown below:

Column 1, line 3, insert the following information:

-- This invention was made with Government support under contract number NAS8-40519 awarded by NASA. The Government has certain rights in this invention. --

Signed and Sealed this

Tenth Day of June, 1997

Attest:

BRUCE LEHMAN

Attesting Officer

Commissioner of Patents and Trademarks